(12) United States Patent
Ogawa et al.

(10) Patent No.: US 8,094,417 B2
(45) Date of Patent: Jan. 10, 2012

(54) MAGNETORESISTANCE DEVICE

(75) Inventors: Susumu Ogawa, Cambridge (GB); Andrew Troup, Cambridge (GB); David Williams, Cambridge (GB); Hiroshi Fukuda, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 366 days.

(21) Appl. No.: 12/390,547

(22) Filed: Feb. 23, 2009

(65) Prior Publication Data

US 2009/0303638 A1  Dec. 10, 2009

(30) Foreign Application Priority Data

Jun. 9, 2008  (EP) .................................... 08157888

(51) Int. Cl.
  *G11B 5/33*  (2006.01)
(52) U.S. Cl. ... 360/313; 360/322; 360/324; 360/327.21; 360/327.24
(58) Field of Classification Search .............. 360/318.1, 360/327.21, 327.24, 327.33
See application file for complete search history.

(56) References Cited

U.S. PATENT DOCUMENTS

| | | | |
|---|---|---|---|
| 4,065,797 A * | 12/1977 | Nomura et al. | 360/316 |
| 4,523,243 A * | 6/1985 | Billington | 360/327.24 |
| 4,978,938 A | 12/1990 | Partin et al. | |
| 5,652,445 A | 7/1997 | Johnson | |
| 7,136,264 B2 * | 11/2006 | Pinarbasi | 360/322 |
| 7,203,036 B2 * | 4/2007 | Chattopadhyay et al. | 360/313 |
| 7,367,111 B2 * | 5/2008 | Fontana et al. | 29/603.13 |

OTHER PUBLICATIONS

European Search Report 08157222.2, Nov. 4, 2008.

* cited by examiner

*Primary Examiner* — Tan T. Nguyen
(74) *Attorney, Agent, or Firm* — Antonelli, Terry, Stout & Kraus, LLP.

(57) ABSTRACT

A magnetoresistance device has a channel extending between first and second ends in a first direction comprising non-ferromagnetic semiconducting material, such as silicon, a plurality of leads connected to and spaced apart along the channel, a gate structure for applying an electric field to the channel in a second direction which is substantially perpendicular to the first direction so as to form an inversion layer in the channel and a face which lies substantially in a plane defined by the first and second directions and which is configured such that an edge of the channel runs along the face.

22 Claims, 20 Drawing Sheets

MAGNETORESISTANCE DEVICE

FIELD OF THE INVENTION

The present invention relates to a magnetoresistance device particularly, but not exclusively, for use as a magnetic field sensor or a read head in a hard disk drive.

BACKGROUND

Hard disk drives (HDDs) are widely used for high-density information storage. HDDs are commonly found in computer systems traditionally associated with this type of storage, such as servers and desktop computers. However, HDDs having smaller form factors, such as one-inch drives, can also be found in hand-held electronic devices, such as music players and digital cameras.

Higher storage capacity in HDDs can be achieved by increasing storage density. Storage density is currently doubling roughly every year and the highest storage density presently achievable using conventional technology, such as by recording data in bit cells which are arranged longitudinally in the magnetic recording medium and reading data using so-called "spin value" read heads, is about 100 Gb/in$^2$.

However, as storage density in HDDs continues to increase, then recording media and read heads encounter the problem of the superparamagnetic effect.

The superparamagnetic effect arises when the size of a ferromagnetic grain is sufficiently reduced that the energy required to change direction of magnetisation of the grain is comparable to the thermal energy. Thus, the magnetisation of the grain is liable to fluctuate and so lead to data corruption.

For recording media, a solution to the problem has been demonstrated which involves arranging bit cells perpendicularly (rather than longitudinally) to the surface of the recording medium which allows each bit cell to be large enough to avoid the superparamagnetic effect.

To address this problem in read heads, it been proposed to avoid using any ferromagnetic material and to take advantage of the so-called extraordinary magnetoresistance (EMR) effect.

A device exhibiting the EMR effect is described in "Enhanced Room-Temperature Geometric Magnetoresistance in Inhomogeneous Narrow-Gap Semiconductors", by S. A. Solin, T. Thio, D. R. Hines and J. J. Heremans, Science volume 289, p. 1530 (2000). The device is arranged in a van der Pauw configuration and includes a highly conductive gold inhomogeneity concentrically embedded in a disk of non-magnetic indium antimonide (InSb). At zero applied magnetic field (H=0), current flows through the gold inhomogeneity. However, at non-zero applied magnetic field (H≠0), current is deflected perpendicularly to the field-line distribution, around the gold inhomogeneity and through the annulus. This gives rise to a drop in conductance.

Currently, high mobility narrow gap semiconductors with low carrier density, such as indium antimonide ($\mu_n$=7×10$^4$ cm$^2$V$^{-1}$s$^{-1}$ at 300° K), indium arsenide ($\mu_n$=3×10$^4$ cm$^2$V$^{-1}$s$^{-1}$ at 300° K) and gallium arsenide ($\mu_n$=8.5×10$^3$ cm$^2$V$^{-1}$s$^{-1}$ at 300° K), seem to be the best candidates for EMR-based read heads.

"Nanoscopic magnetic field sensor based on extraordinary magnetoresistance" by S. A. Solin, D. R. Hines, A. C. H. Rowe, J. S. Tsai, and Yu A. Pashkin, Journal of Vacuum Science and Technology, volume B21, p. 3002 (2003) describes a device having a Hall bar-type arrangement having an indium antimonide/indium aluminium antimonide (InSb/In$_{1-x}$Al$_x$Sb) quantum well heterostructure.

A drawback of this device is that it requires a thick (i.e. about 75 nm) passivation layer to protect and confine the active layer as well as an insulating coat in the form of a layer of silicon nitride. This increases the separation between the channel and magnetic media and so reduces magnetic field strength and, thus, the output signal.

Silicon does not require passivation and silicon-based magnetic field sensors exhibiting magnetoresistance are known.

For example, EP-A-1 868 254 describes a device exhibiting the extraordinary magnetoresistance effect having a channel formed of silicon. A conductor formed of titanium silicide or highly-doped silicon acts as a shunt and is connected to the channel along one side of the channel. Leads are connected to and spaced along the channel on the opposite side of the channel.

However, silicon has lower mobility and so device performance tends to be poorer.

The present invention seeks to provide an improved magnetoresistance device.

SUMMARY

According to a first aspect of certain embodiments of the present invention there is provided a magnetoresistance device having a channel extending between first and second ends in a first direction comprising non-ferromagnetic semiconducting material, a plurality of leads connected to and spaced apart along the channel, a gate structure for applying an electric field to the channel in a second direction which is substantially perpendicular to the first direction so as to form an inversion layer in the channel and a face which lies substantially in a plane defined by the first and second directions and which is configured such an edge of the channel runs along the side face. The face may be a side face. The gate structure may lie above or below the channel.

Thus, the face may be presented to the upper surface of a magnetic media which can have the advantage of allowing the channel to be brought close to the surface of a magnetic media. If the non-ferromagnetic semiconducting material is silicon or some other non-ferromagnetic semiconducting material which does not require passivation, then the separation between the channel and the surface of a magnetic media can very small (e.g. less than about 10 nm).

The plurality of leads may comprise two leads, three leads or four leads. The plurality of leads may comprise more than four leads.

The gate structure may comprise a gate electrode separated from the channel by a gate dielectric for applying an electric field to the channel.

The gate structure can be used to form an inversion layer in the channel in an undoped or lightly-doped semiconducting material which has a higher mobility than the same but heavily-doped semiconducting material which would otherwise be needed to reduce the resistance of the device and so improve device performance.

The gate structure may be a top gate structure wherein the gate dielectric is disposed on the channel and the gate electrode is disposed on the gate dielectric. The gate structure may be a bottom gate structure. The gate electrode may comprise semiconducting material and may comprise silicon, such as doped silicon. The gate electrode may comprise highly-doped silicon, e.g. doped with an impurity having a concentration of at least about 1×10$^{19}$ cm$^{-3}$. The gate electrode may comprise n-type semiconducting material.

The channel may comprise silicon or silicon germanium. The channel may be undoped or doped with an impurity, e.g. a donor, having a concentration up to about $1\times10^{16}$ cm$^{-3}$. The channel may be strained.

The layer structure may include a layer of the non-ferromagnetic semiconducting material disposed on the substrate and the channel may be formed in the layer of non-ferromagnetic semiconducting material. Additionally or alternatively, the substrate may include a region of the non-ferromagnetic semiconducting material and the channel is formed in the substrate.

The device may further comprise a conductive region comprising non-ferromagnetic material having a higher conductivity than the channel and connecting at least two sections of the channel. Thus, the conductive region may provide a shunt.

The conductive region may comprise semiconducting material, such as silicon. The conductive region may be doped with an impurity having a concentration of at least about $1\times10^{19}$ cm$^{-3}$. The conductive region may lie under the channel. The conductive region may be formed in a region of the substrate.

The device may be a read head for a hard disk drive.

According to a second aspect of certain embodiments of the present invention there is provided apparatus comprising the magnetoresistance device and a magnetic field source, the magnetic field source and device arranged such that, when a magnetic field is applied to the device, the magnetic field passes substantially perpendicularly through the side face.

According to a third aspect of certain embodiments of the present invention there is provided a method of operating a magnetoresistance device having a channel extending between first and second ends in a first direction comprising non-ferromagnetic semiconducting material, a plurality of leads connected to and spaced apart along the channel in a second direction which is substantially perpendicular to the first direction, a gate structure for applying an electric field to the channel so as to form an inversion layer in the channel and a face which lies substantially in a plane defined by the first and second directions and which is configured such that an edge of the channel runs along the side face, the method comprising driving a current between two leads and measuring a voltage developed between two leads.

According to a fourth aspect of certain embodiments of the present invention there is provided a method of operating a magnetoresistance device having a channel extending between first and second ends in a first direction comprising non-ferromagnetic semiconducting material, a plurality of leads connected to and spaced apart along the channel, a gate structure for applying an electric field to the channel in a second direction which is substantially perpendicular to the first direction so as to form an inversion layer in the channel and a face which lies substantially in a plane defined by the first and second directions configured such that an edge of the channel runs along the face, the method comprising applying a bias of appropriate polarity and sufficient magnitude so as to form of an inversion layer in the channel.

According to a fifth aspect of certain embodiments of the present invention there is provided method of fabricating a magnetoresistance device, the method comprising providing a channel extending between first and second ends in a first direction comprising non-ferromagnetic semiconducting material, a plurality of leads connected to and spaced apart along a side of the channel and a gate structure for applying an electric field to the channel in a second direction which is substantially perpendicular to the first direction so as to form an inversion layer in the channel, and defining a face which lies substantially in a plane defined by the first and second directions and which is configured such that an edge of the channel runs along the face.

Removing the side of the layer structure and the substrate may comprise lapping the layer structure and the substrate.

According to a sixth aspect of certain embodiments of the present invention there is provided a magnetoresistance device having a channel arranged comprising non-ferromagnetic semiconducting material, a plurality of leads connected to and spaced apart along the channel, a gate structure for applying an electric field to the channel so as to form an inversion layer in the channel and a side face configured such that a side of the channel runs along the side face.

BRIEF DESCRIPTION OF THE DRAWINGS

Some embodiments of the present invention will now be described, by way of example, with reference to the accompanying drawings in which.

DETAILED DESCRIPTION OF CERTAIN EMBODIMENTS

First Embodiment

Referring to FIGS. 1 to 4, a first embodiment of a magnetoresistance device 1 according to the present invention is shown.

The device 1 includes a layer structure 2 disposed on an upper surface 3 of a substrate 4. The substrate 4 comprises p-type single crystal silicon having a conductivity of about 10 Ωcm.

Figure 1:
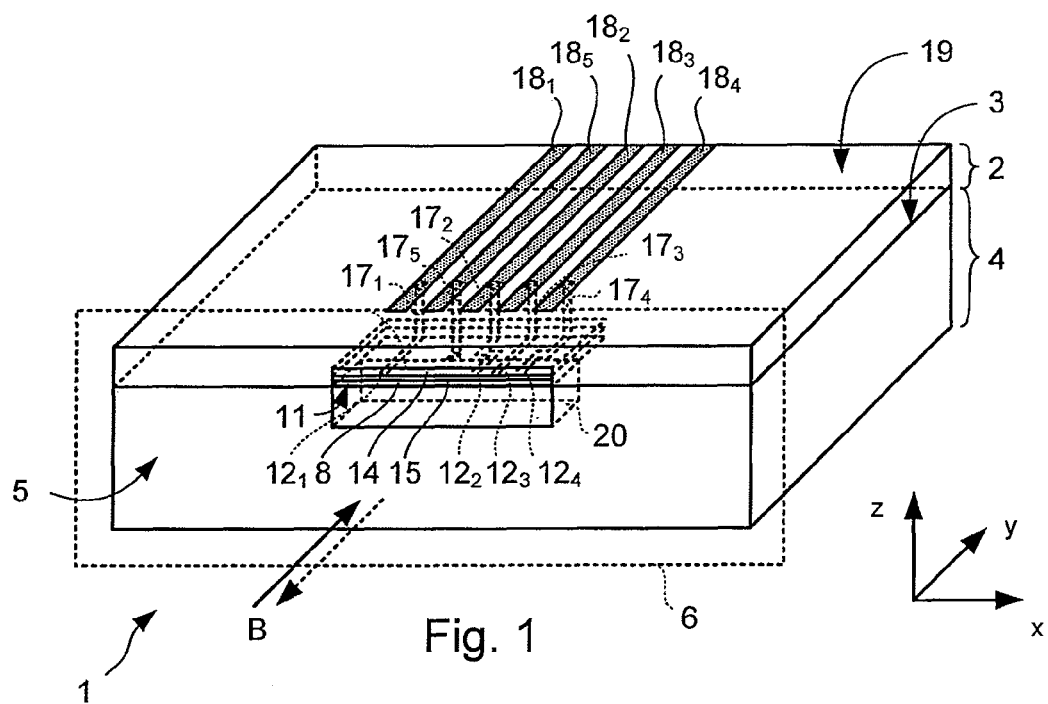
FIG. 1 is a schematic perspective view of a first embodiment of a magnetoresistance device according to the present invention.

The device 1 has a side face 5 which is substantially flat and lies in a plane 6 which cuts through the layers of the layer structure 2 and the upper surface 3 of a substrate 4. For example, as shown in FIG. 1, a growth axis corresponds to the z-axis, the upper surface 3 of the substrate 4 lies in an x-y plane and the side face 5 lies in an x-z plane. As will be explained in more detail later, the side face 5 is formed by lapping and the device 1 may be used as a read head in a hard disk drive with the side face 5 providing an air bearing surface (ABS). In certain embodiments, the side face 5 (or at least part of the side face 5) is covered by a thin protective layer (not shown) of dielectric material, e.g. having a thickness of equal to or less than about 10 nm, equal to or less than about 5 nm, equal to or less than 2 nm or equal to or less than about 1 nm. The protective layer (not shown) may be formed of silicon dioxide ($SiO_2$) and may form naturally. The protective layer (not shown) may be kept as thin as possible and/or be made of a material having a relative permeability, $\mu_r$, so as to keep magnetic field strength high. The side face 5 is substantially flat across the whole side of the device 1.

The device 1 includes a layer 7 of epitaxially-grown, undoped single crystal silicon (Si) having a thickness, $t_1$, of about 30 nm. The silicon layer 7 provides a channel 8 and, when a large enough electric field is applied, an inversion layer (FIGS. 6a & 6b) which is generally rectangular in plan view, which extends between first and second ends 9, 10 and which has a first edge or side 11 which runs along the side face 5.

The undoped silicon layer 7 includes first, second, third and fourth heavily-doped n-type implanted regions $12_1$, $12_2$, $12_3$, $12_4$ (hereinafter referred to as "leads") which provide electrical connections to and along the channel 8. The leads $12_1$, $12_2$, $12_3$, $12_4$ are doped with an n-type impurity in the form of arsenic (As) to a concentration of about $1\times10^{20}$ cm$^{-3}$ and have a thickness, $t_2$, of about 20 nm.

The device 1 includes a top gate structure 13. The gate structure 13 includes a gate electrode 14 formed of a patterned layer of heavily-doped n-type polycrystalline silicon (Si) having a thickness, $t_3$, of about 100 nm and a gate dielectric 15 formed of a co-extensive (in plan view) patterned layer 14 of silicon dioxide ($SiO_2$) having a thickness, $t_4$, of about 5 nm. During fabrication, the gate electrode 14 provides a mask for implantation. The gate electrode 13 may be formed of one or more layers of metal or metal alloy, such as aluminium or gold. The gate structure 13 also has an edge or side which runs along the side face 5.

Figures 6A, 6B:
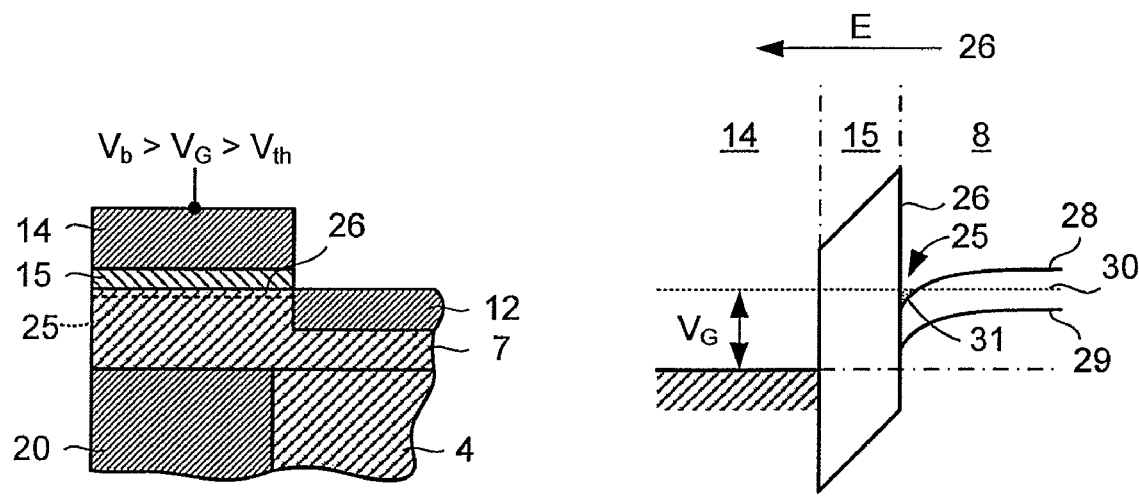
FIGS. 6a and 6b illustrate formation of an inversion layer in the device shown in FIG. 2.

As will be explained in more detail later, the gate structure 13 can be used to apply a sufficiently high electric field to the undoped silicon layer 7 to form an inversion layer 25 (FIGS. 6a & 6b) and defines the extent of the channel 8. Thus, the gate structure 13 is substantially co-extensive with the channel 8 and the inversion layer 25 (FIGS. 6a & 6b). There may be small differences (e.g. a few nanometers) between the extent of the gate structure 13 and channel 8, for example, due to undercut or overcut profile. The gate structure 13 also has an edge or side which runs along the side face 5. The channel 8 extends at least a given (perpendicular) distance, W, away from the side face 5 and has a second, opposite side 11' which is lithographically defined (by virtue of the gate structure 13) and which does not does not run along, nor is close (e.g. closer than about 50 nm) to any side faces of the device 1.

Not all parts or regions of the channel 8 contribute equally to the behaviour or response of the device 1. In particular, an effective channel $8_{eff}$ lying near to the side face 5 provides the greatest contribution. The effective channel $8_{eff}$ lies between first and second effective ends $9_{eff}$, $10_{eff}$ in a region between the first and fourth leads $12_1$, $12_4$ (shown lightly shaded in FIG. 2) in which the leads $12_1$, $12_2$, $12_3$, $12_4$ are most closely separated and, thus, has lowest resistance.

The gate structure 13 and undated epitaxial silicon layer 7 are covered by an insulating top layer 16 of silicon dioxide ($SiO_2$) having a thickness, $t_5$, of about 400 nm. Other insulating materials may be used instead of silicon dioxide, such as aluminium oxide ($Al_2O_3$).

The insulating top layer 16 includes contact holes $17_1$, $17_2$, $17_3$, $17_4$, $17_5$ (or "vias"). The leads $12_1$, $12_2$, $12_3$, $12_4$ and the gate electrode 15 are contacted by conductive tracks $18_1$, $18_2$, $18_3$, $18_4$, $18_5$ formed of a layer of aluminium (Al) which run over an upper surface 19 of the insulating layer 16 and into the contact holes $17_1$, $17_2$, $17_3$, $17_4$, $17_5$. The gate structure 13 lies over the channel 8 such that the gate 14 lies in the x-y plane. As shown in FIG. 1, when a magnetic field B is applied (perpendicularly) to the side face 5 along the y-axis, the magnetic field passes in the plane of the gate 14.

The substrate 4 includes a heavily-doped n-type region (or "well") 20 which connects at least two sections of the channel 8 and is herein referred to as a "shunt". The shunt 20 is generally rectangular in plan view. The shunt 20 is doped with an n-type impurity in the form of arsenic (As) to a concentration of about $1\times10^{20}$ cm$^{-3}$ and has a thickness, $t_6$, of about 40 nm. As will be explained later, in some embodiments, the device need not include a shunt.

The channel 8 is generally rectangular in plan view and has a length, $l_1$, of about 1 μm and a width, $w_1$, of about 1 μm. The gate structure 13 is generally rectangular in plan view and has a length, $l_2$, of about 1 μm and a width, $w_2$, of about 1 μm. The channel 8 and gate 13 are co-extensive and so $l_1=l_2$ and $w_1=w_2$.

The shunt 20 is elongated and rectangular in plan view having a length, $l_3$, of about 300 nm and a width, $w_3$, of about 40 nm. The leads $12_1$, $12_2$, $12_3$, $12_4$ each have a width, $l_4$, i.e. length along the channel 2, of about 20 nm. The first and second leads $12_1$, $12_2$ are spaced apart having spacing, $s_1$, of about 100 nm. The second, third and fourth leads $12_2$, $12_3$, $12_4$ are spaced apart having spacing, $s_2$, of about 20 nm.

The effective channel $8_{eff}$ has a length, $l_{1eff}$, of about 300 nm and a width, $w_{1eff}$, of about 40 nm, i.e. approximately the width of shunt 20. In embodiments in which the shunt is omitted, the effective width, $w_{1eff}$, is larger.

The face 5 lies substantially in a plane 6 defined by the direction of the channel 8, in this example along the x-axis, and the direction in which gate structure 13 applies electric field to the channel 8, in this example the z-axis. Thus, the face 5 lies substantially in the x-z plane. For example, the face 5 lies in a plane which deviates (i.e. tilts) from the x-z plane preferably by no more than about 10°, more preferably by no more than about 5°, even more preferably by no more than about 2° or yet even more preferably by no more than about 1°.

In operation, the magnetoresistance device 1 can be used as a read head in a hard disk drive to detect a magnetic field B passing perpendicularly or nearly perpendicularly (i.e. a few degrees off perpendicular) to the side face 5. As will be explained in more detail later, the device 1 exhibits a magnetoresistive effect in the thin inversion layer 25 and adjacent region of the channel 8 since the conductivity of the channel 8 varies greatly, e.g. exponentially, with distance from the gate 13. The device 1 need not use a thick passivation layer and so the channel 8 can be brought as close as possible to a magnetic disk.

Figure 2:
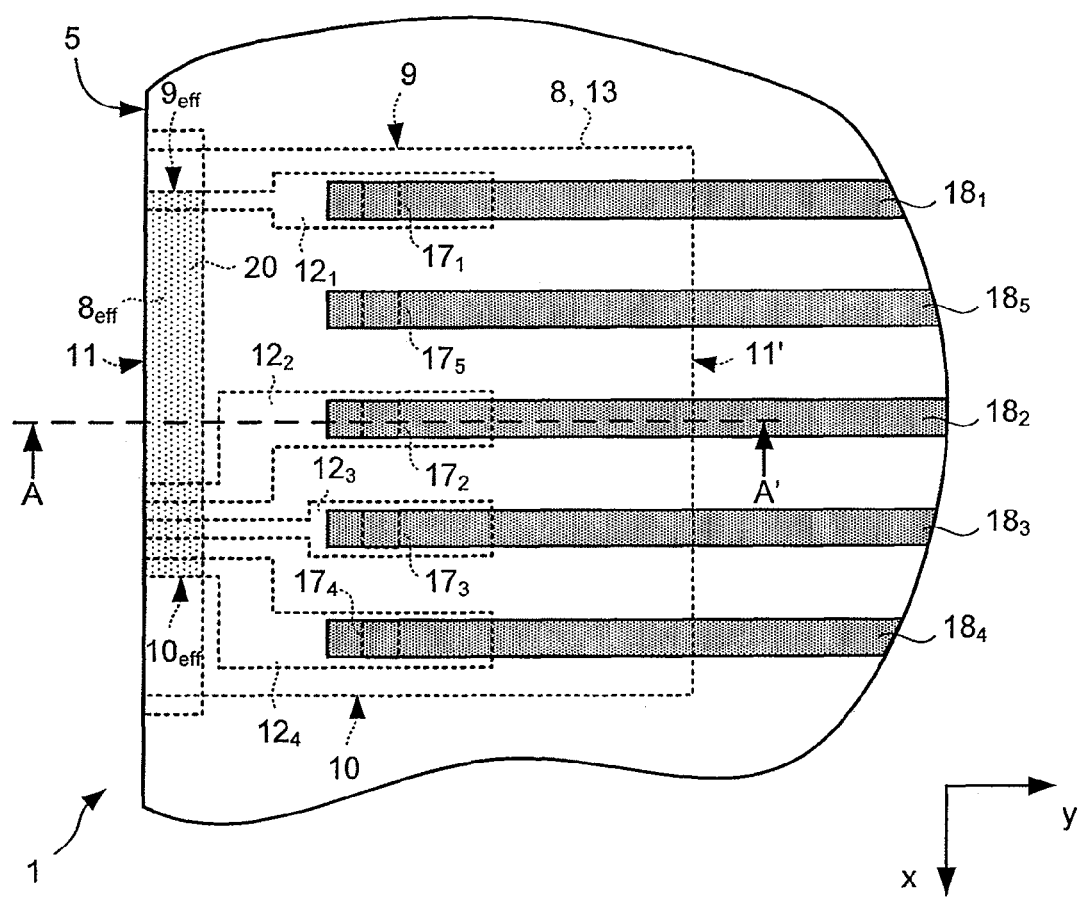
FIG. 2 is a plan view of a first embodiment of a magnetoresistance device in accordance with the present invention.
Figure 3:
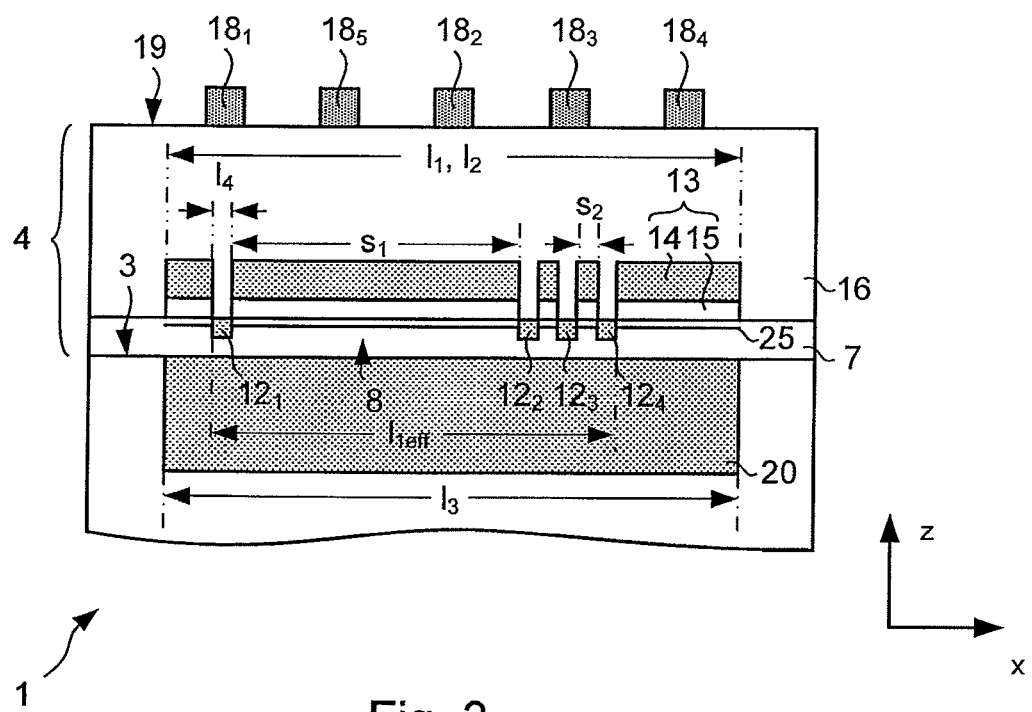
FIG. 3 is a side view the device shown in FIG. 2.
Figure 4:
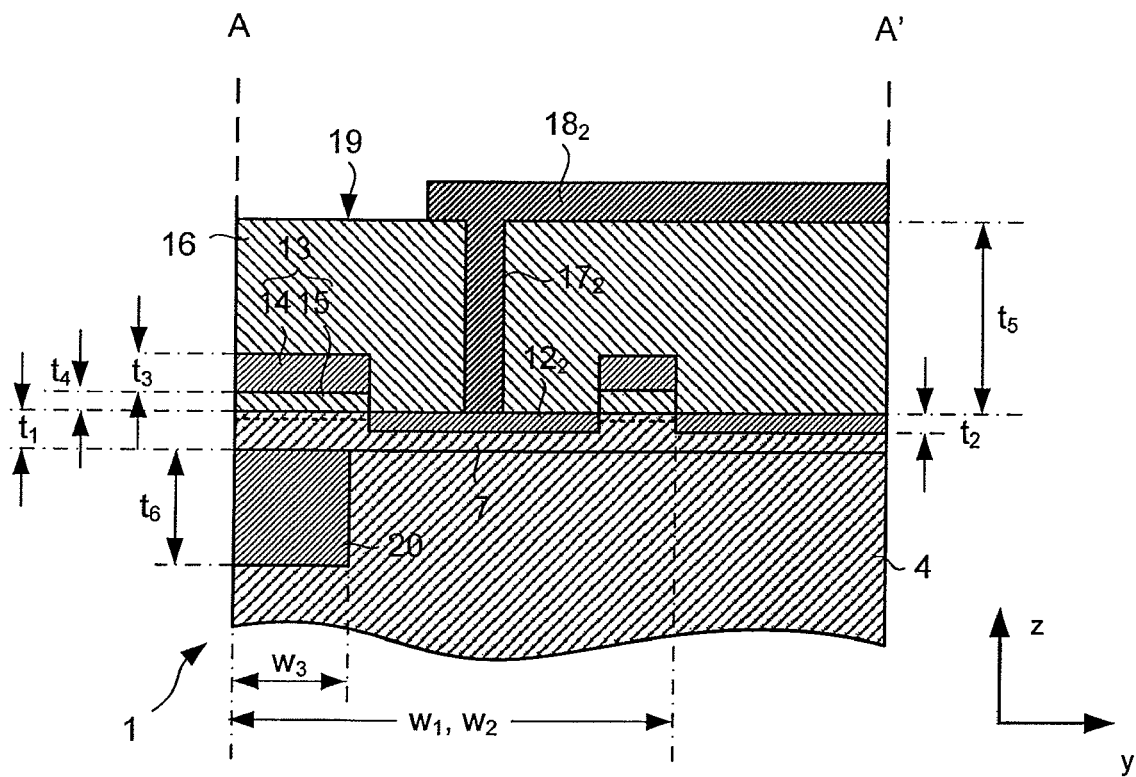
FIG. 4 is a cross-sectional view of the device shown in FIG. 2 taken along the line A-A'.
Figure 5:
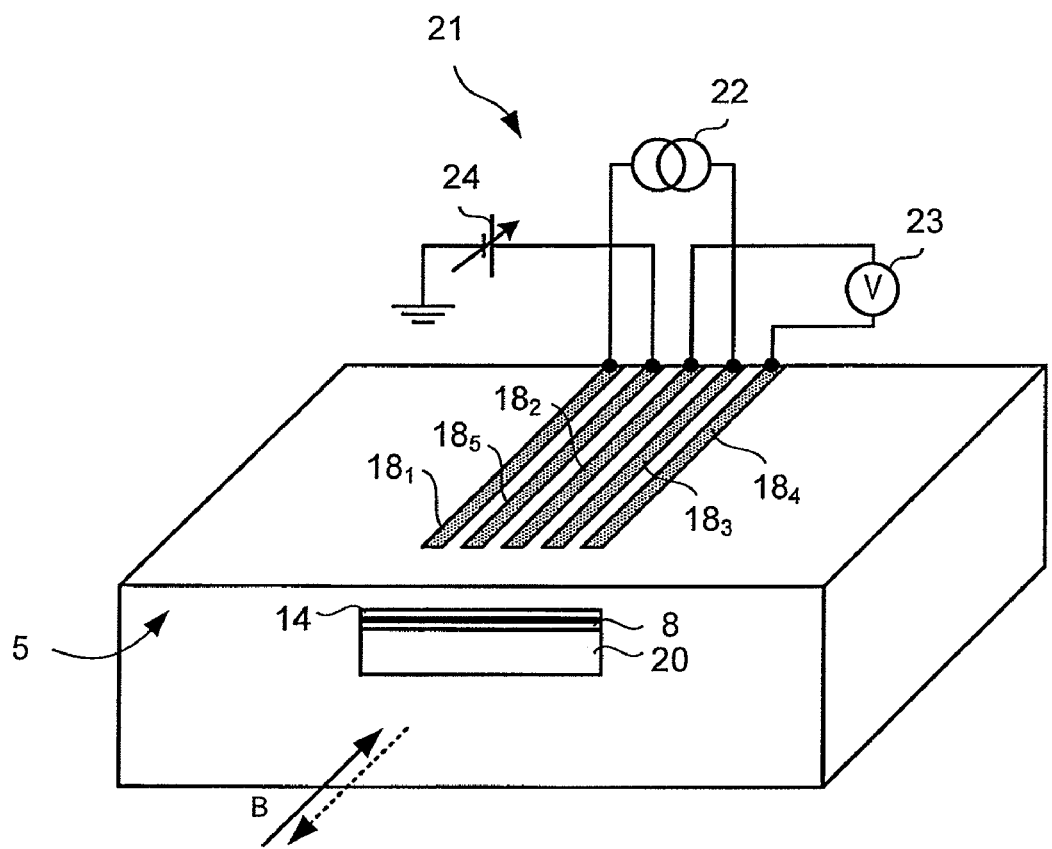
FIG. 5 is a schematic view of circuit arrangement for operating the device shown in FIG. 2.

Referring to FIG. 5, a circuit configuration 21 for operating the magnetoresistance device 1 is shown. The circuit configuration 21 includes a current source 22 configured to drive current, I, through the channel 8 between the first lead $12_1$ (FIG. 2) and the third lead $12_3$ (FIG. 2) and a voltmeter 23 configured to measure voltage, V, developed across the second and fourth leads $12_2$, $12_4$ (FIG. 2). This configuration can be referred to as an "IVIV" configuration, geometry or arrangement. A voltage source 24 is used to apply a bias, $V_G$, to the gate electrode 14.

Referring to FIGS. 6a and 6b, an inversion layer 25 is formed in the undoped channel 8 adjacent to an interface 26 between the gate dielectric 15 and the silicon channel 8 when a sufficiently large voltage, $V_G$, exceeding a threshold voltage, $V_{th}$, but not exceeding a gate dielectric breakdown voltage, $V_b$, is applied to the gate electrode 14. Values for the threshold voltage $V_{th}$ and the gate dielectric breakdown voltage, $V_b$, can be found by routine experiment. The values usually depend on the material chosen for the silicon layer 7 and the gate dielectric 15 and the thickness of the gate dielectric 15.

Referring in particular to FIG. 6b, applying a voltage to the gate electrode 14 generates an electric field 27 at the interface 26 causing the conduction and valence bands 28, 29 in the channel 8 to bend. If a sufficiently large voltage, $V_G$, is applied to the gate electrode 14, then the electric field 26 causes the conduction band 28 to bend below the Fermi level 30 and form a potential well 31 in which free electrons can accumulate, i.e. to form an inversion layer 25. The thickness of the inversion layer 25 can be as small as 1 nm.

FIGS. 6a and 6b illustrate band bending resulting in accumulation of electrons. If a sufficiently large gate voltage of opposite polarity is applied, which exceeds another threshold voltage, then this can result in hole accumulation. However, the mobility of electrons is usually higher than the mobility of holes, i.e. $\mu_e > \mu_h$, and so device performance based on electron accumulation is used here.

The current flowing between the first and third electrodes $12_1$, $12_3$ (FIG. 2) flows mainly in the inversion layer 25. When a magnetic field B is applied perpendicularly to the side face 5, a force acts on electrons causing them to bend perpendicularly to the plane of the inversion layer 25 (FIG. 6a). The direction in which the electrons bend depends on the direction of the applied magnetic fields. As the resistance of the channel varies with distance from the gate, this results in a magnetoresistance between second and fourth electrodes $12_1$, $12_3$ (FIG. 2).

Figure 7:
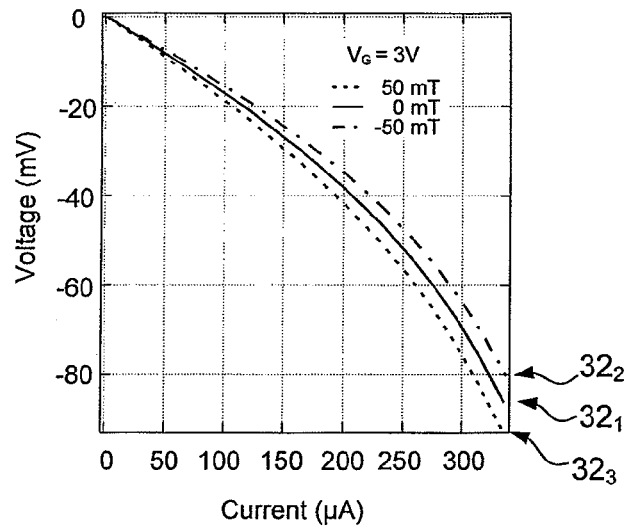
FIG. 7 illustrates current-voltage characteristics of the device shown in FIG. 2 at a first, fixed gate voltage at three different values of magnetic field.

FIG. 7 illustrates voltage-current characteristics $32_1$, $32_2$, $32_3$ of the device 1 (FIG. 1) at a gate voltage of 3V and at three different magnetic fields, namely, B=0 mT, +50 mT and −50 mT, applied perpendicular to the side face 5 (FIG. 1). The measurement is taken using the same configuration and in which voltage, V, is sensed between the second and fourth leads $12_2$, $12_4$ (FIG. 2) while sweeping current, I, driven through the channel 8 between the first and third leads $12_1$, $12_3$ (FIG. 2).

Figure 8:
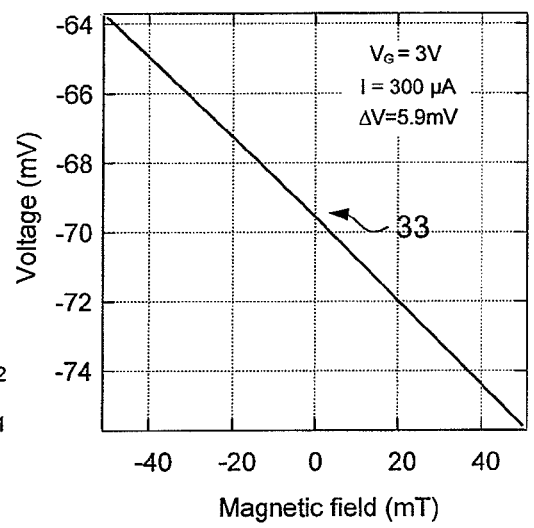
FIG. 8 illustrates voltage-magnetic field characteristic of the device shown in FIG. 2 at a fixed current and at a first, fixed gate voltage.

FIG. 8 illustrates a voltage-magnetic field characteristic 33 of the device 1 (FIG. 1) at a gate voltage of 3V and a current of 300 μA driven between the first and second leads $12_1$, $12_3$ (FIG. 2) as magnetic applied perpendicular to the side face 5 (FIG. 1) is swept from −50 mT to +50 mT.

If (using another different measurement configuration) the third lead $12_3$ is grounded and the first lead $12_1$ (FIG. 2) is biased at 1V, then the current, I, flowing between the first and third leads $12_1$, $12_3$ (FIG. 2) is around 330 μA, which means the resistance between the first and third leads $12_1$, $12_3$ (FIG. 2) is about 3 kΩ.

The measured resistance (using yet another different configuration) between second and fourth electrodes $12_2$, $12_4$ (FIG. 2) is almost half of the resistance between the first and third leads $12_1$, $12_3$ (FIG. 2) for the same gate voltage, $V_G$.

As shown in FIG. 7, the output voltage between the second and fourth electrodes $12_2$, $12_4$ (FIG. 2) increases as the current between the first and second leads $12_1$, $12_3$ (FIG. 2).

As shown in FIG. 8, if a current of 300 μA is applied between the first and second leads $12_1$, $12_3$ (FIG. 2), then the change of output voltage (ΔV) measured between the second and fourth electrodes $12_2$, $12_4$ (FIG. 2) is 5.9 mV when the change in applied magnetic field (ΔB) is 50 mT.

Figure 9:
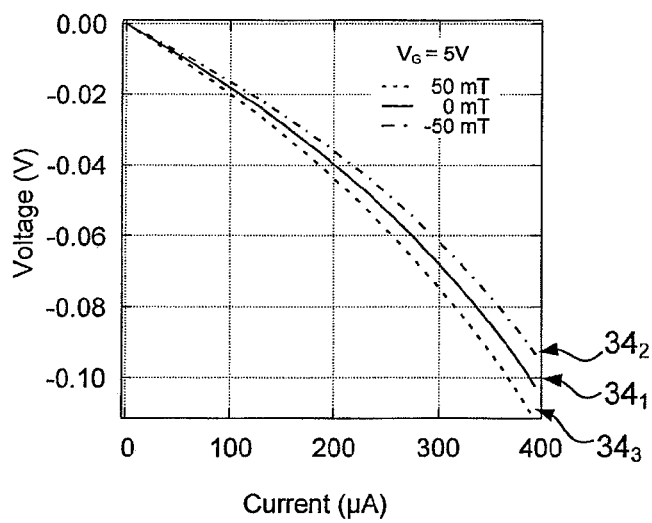
FIG. 9 illustrates current-voltage characteristics of the device shown in FIG. 2 at a second, higher fixed gate voltage at three different values of magnetic field.
Figure 10:
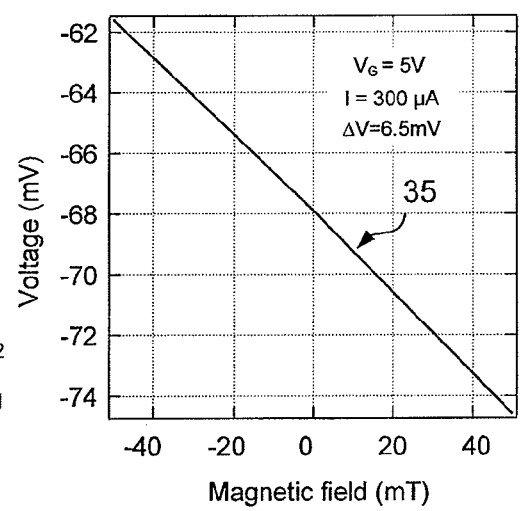
FIG. 10 illustrates voltage-magnetic field characteristic of the device shown in FIG. 2 at a fixed current and at a second, higher fixed gate voltage.

Referring to FIGS. 9 and 10, the device 1 is again measured under similar conditions but using gate bias of 5V, and another set of characteristics are obtained $34_1$, $34_2$, $34_3$, 35. As shown in FIGS. 9 and 10, the output voltage is higher.

Referring in particular to FIG. 10, if a current of 300 μA is applied between the first and second leads $12_1$, $12_3$, then the change of output voltage (ΔV) measured between the second and fourth electrodes $12_2$, $12_4$ (FIG. 2) is 6.5 mV when the change in applied magnetic field (ΔB) is 50 mT.

The output voltage scales with the size of the device and so becomes larger as the device becomes larger. The electrodes $12_1$, $12_2$, $12_3$, $12_4$ and ion-implanted shunt 20 have negligible contact resistances.

The device 1 outputs a signal which is about three to four orders of magnitude greater than a device described in EP-A-1 868 254.

Figure 11:
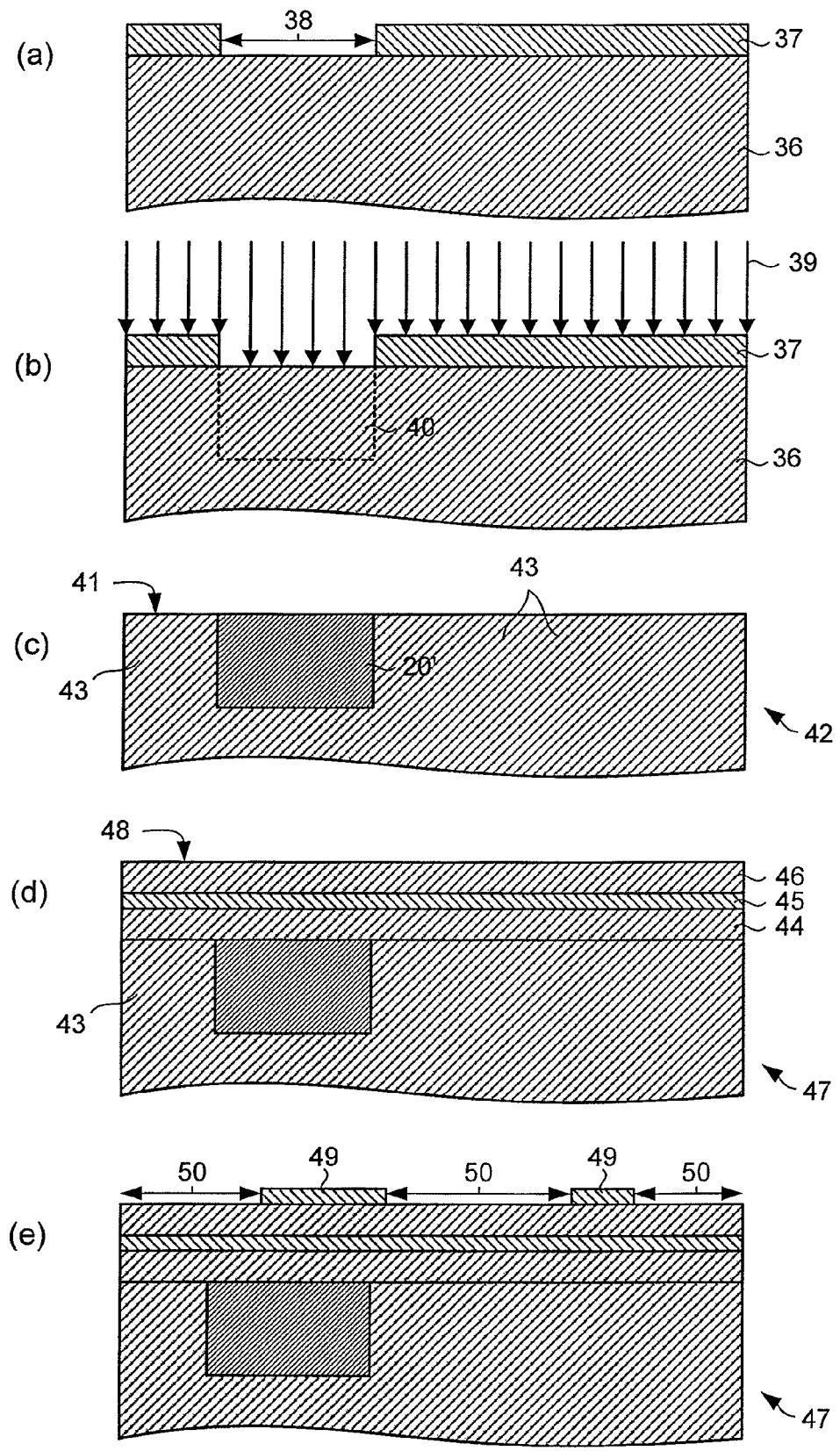
FIGS. 11a to 11r illustrate the device shown in FIG. 2 at different stages during fabrication.
Figure 11:
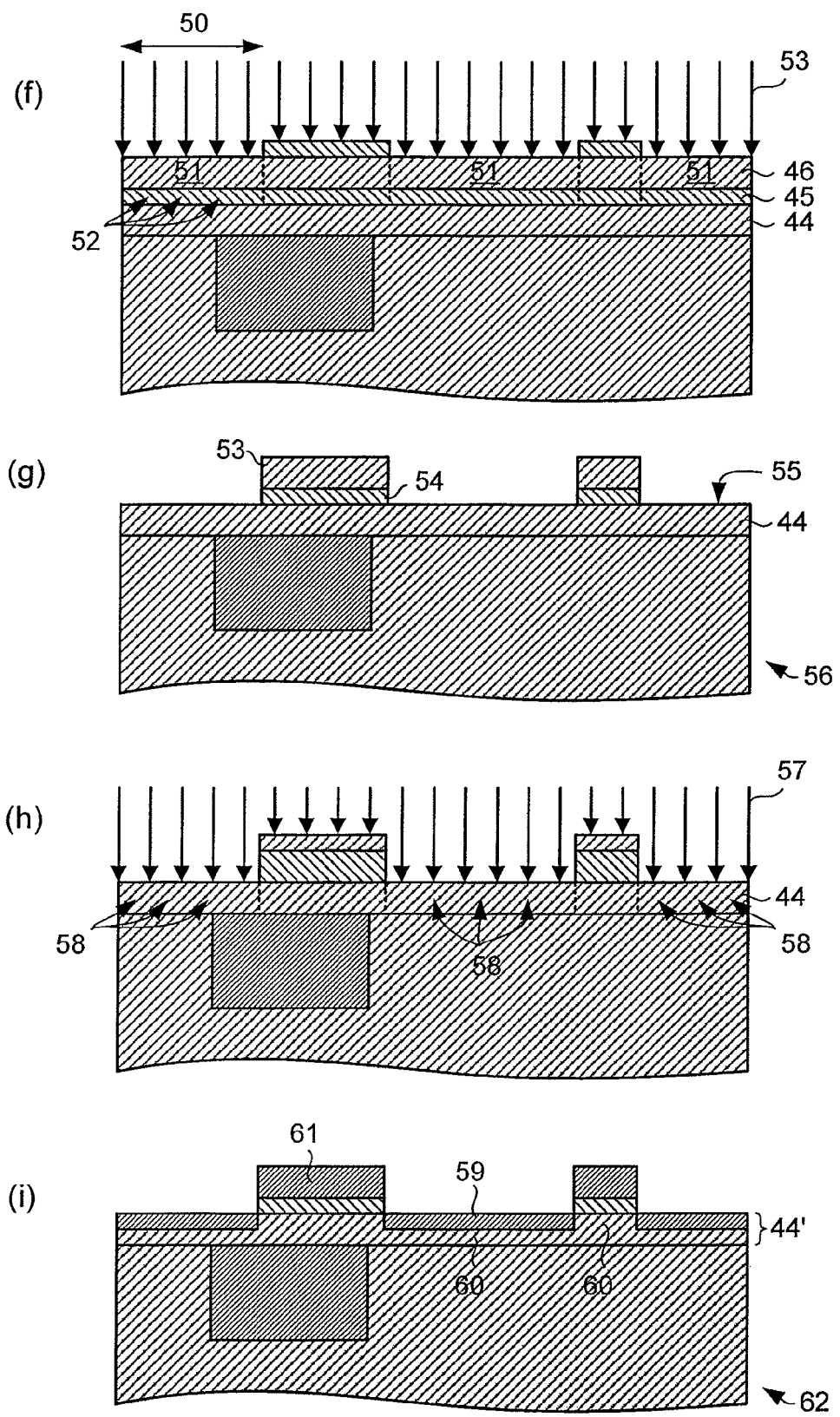
Figure 11:
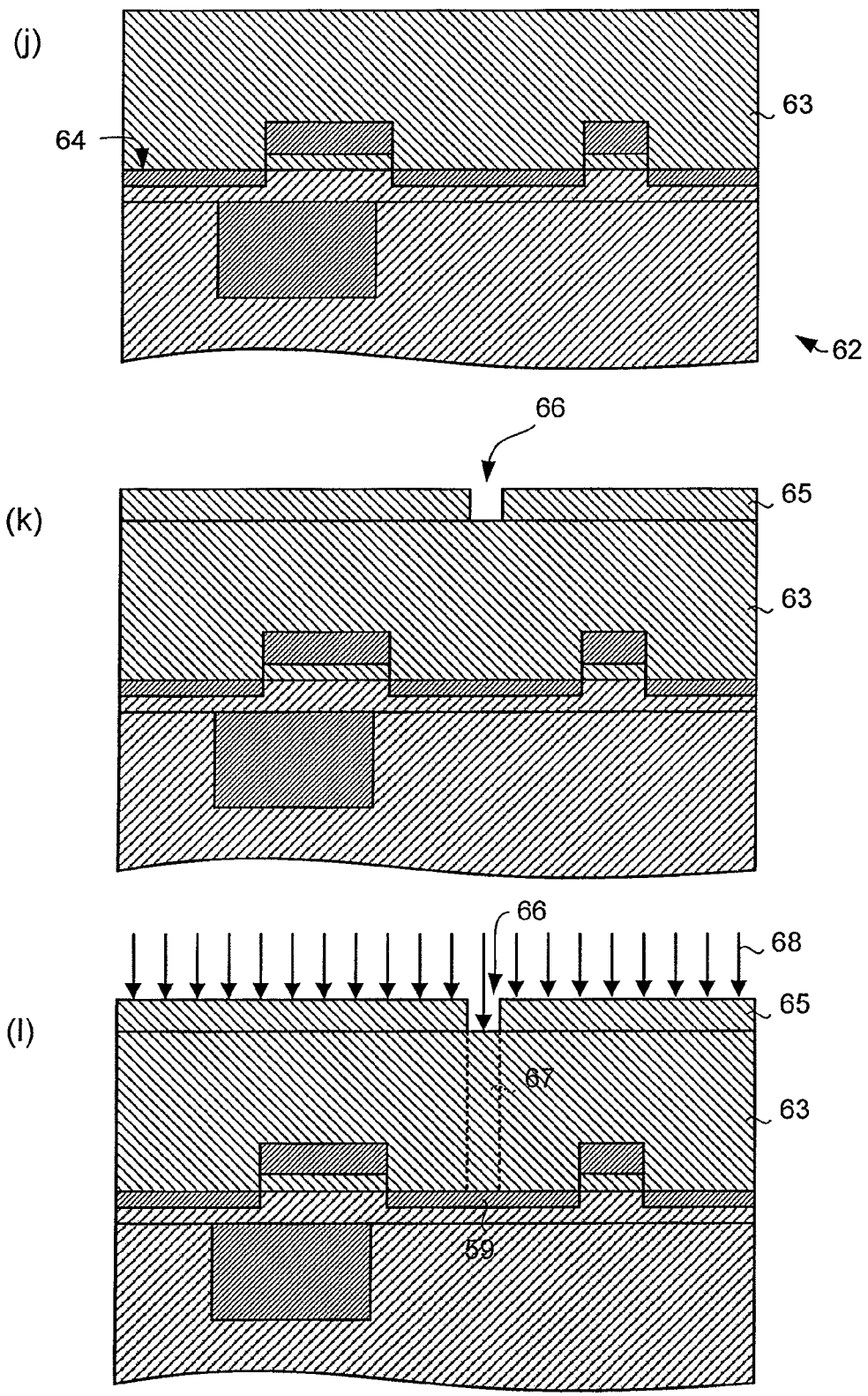
Figure 11:
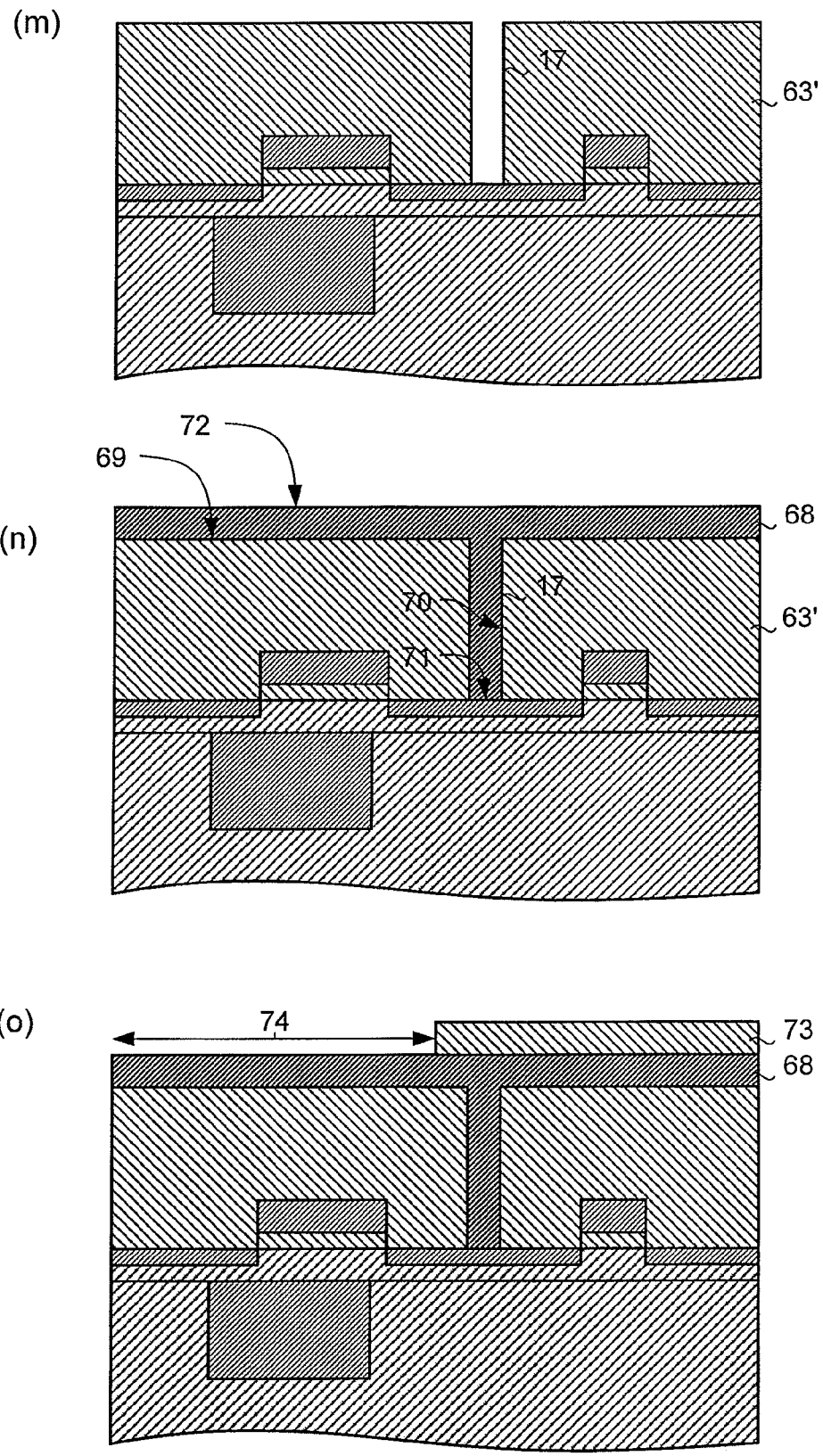
Figure 11:
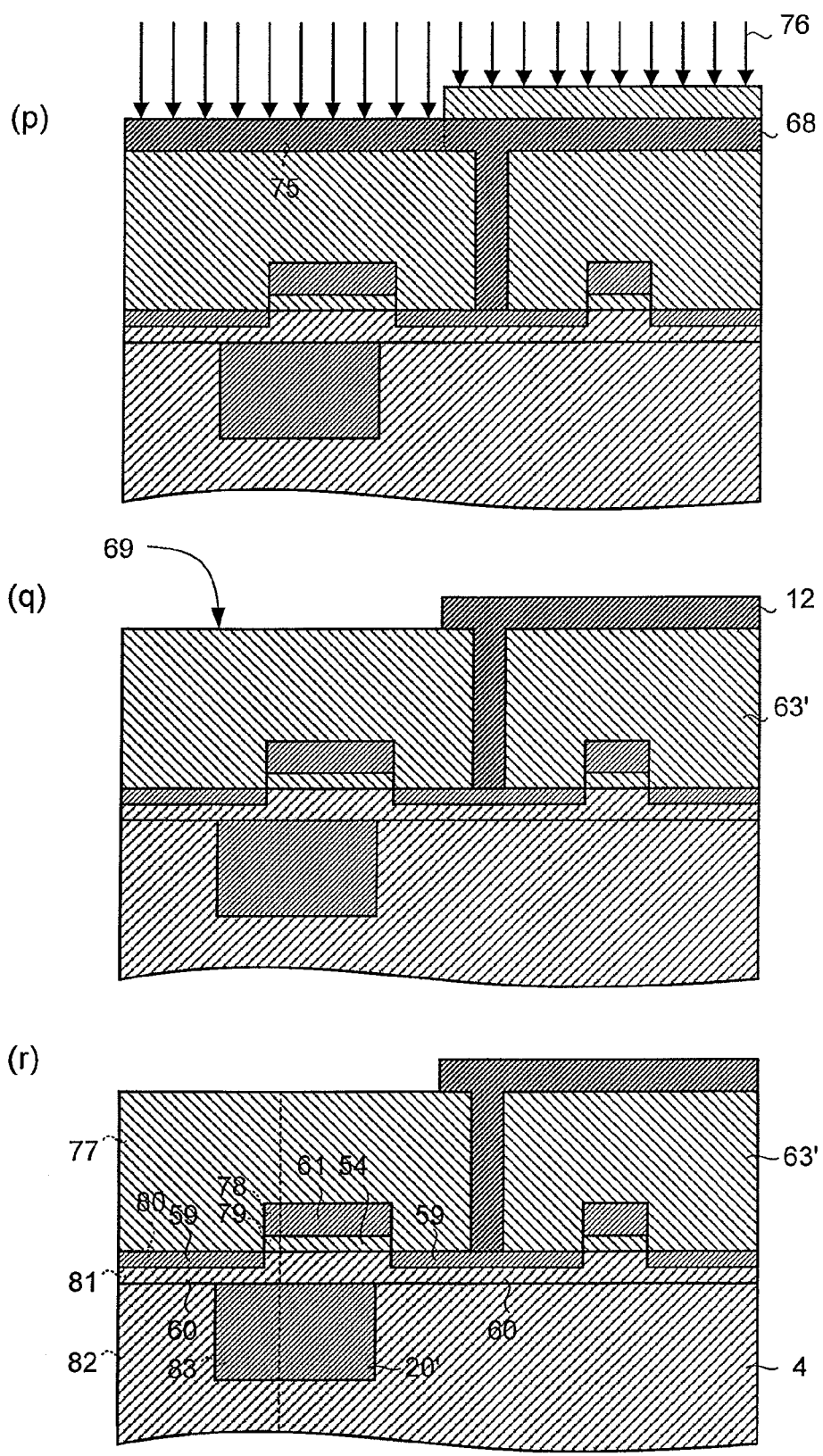

Referring to FIGS. 11a to 11q, a method of fabricating the device 1 will now be described.

A p-type silicon wafer 36 (FIG. 11a) is cleaned using acetone and IPA. A layer (not shown) of optical resist is spun-on. The optical resist layer (not shown) is patterned using a mask (which is also referred to as a reticle) and a UV light source and developed using an optical resist developer.

Referring to FIG. 11a, optical lithography stage leaves a patterned optical resist layer 37 leaving an unexposed area 38 defining the shunt 20 (FIG. 1).

Referring to FIG. 11b, the wafer 36 is loaded into an ion implantation chamber (not shown). Arsenic (As) ions 39 at about 10 keV are implanted into the unmasked regions 40 of the wafer 36. The resist 37 is removed and the wafer 36 is laser annealed to activate the implant.

Referring to FIG. 11c, implantation leaves an $n^+$ well 20' at the surface 41 of the implanted wafer 42 having a doping concentration of about $1 \times 10^{20}$ cm$^{-3}$ and unimplanted regions 43.

The implanted wafer 43 is cleaned using a 3:1 $H_2SO_4$:$H_2O_2$ (commonly known as a "Piranha etch"). Then, the surface oxide (not shown) is removed by a short dip in 2:5:3 $NH_2F:C_2H_4O_2:H_2O$ (also known as a "SILOX etch") and loaded into a reactor chamber (not shown).

Referring to FIG. 11d, a layer 44 of undoped silicon (Si) having a thickness of 30 nm is grown epitaxially by chemical vapour deposition (CVD). A layer 45 of silicon dioxide ($SiO_2$) having a thickness of 5 nm is grown by wet oxidation (i.e. oxidation in $H_2O$) at about 800° C. followed by a layer 46 of $n^+$ polycrystalline silicon having a thickness of 100 nm by chemical vapour deposition (CVD).

At this stage the wafer 47 may be divided into chips. The wafer 47 (or a chip) may be processed further as follows:

The wafer is cleaned using a Piranha etch, followed by a dip in a SILOX etch. A layer (not shown) of PMMA is applied (e.g. spun-on) to an upper surface 48 of the wafer 48 and cured by baking.

The PMMA layer (not shown) is patterned using a scanning electron beam and developed using a mixture of IPA and water to leave a patterned PMMA layer (not shown). The chip is given a short, for example 3-minute, oxygen plasma ash, then a 30-nm thick layer of aluminium is thermally evaporated over the PMMA-patterned surface of the chip. The developed resist is "lifted-off" in acetone, then rinsed in IPA to leave an aluminium etch mask 49 (which provides a so-called "hard etch mask") and unmasked areas 50 of the wafer 48 as shown in FIG. 11e.

Referring to FIG. 11f, in the unmasked areas 50, regions 51, 52 of the silicon and silicon dioxide layers 45, 46 are etched by a reactive ion etch 53 using a mixture of carbon tetrafluoride and silicon tetrachloride ($CF_4:SiCl_4$) as a feed gas.

The aluminium etch mask 49 is removed using a base, such as $(CH_3)_4NOH$.

In some embodiments, a soft etch mask, such as an e-beam resist, may be used. A negative resist may be used instead of a positive resist.

Referring to FIG. 11g, the structure of the device at this stage in processing is shown. A patterned silicon layer 53 and a coextensive underlying silicon dioxide layer 54 lie on an upper surface 55 of the undoped epitaxial silicon layer 44.

The patterned silicon and silicon dioxide layers 53, 54 provide an implantation mask leaving areas of the wafer 56 unmasked.

Referring to FIG. 11h, the wafer 56 is cleaned and loaded into an ion implantation chamber (not shown). Arsenic (As) ions 57 at about 5 keV are implanted into the patterned silicon layer 53 (which is unmasked) and unmasked regions 58 of the undoped epitaxial silicon layer 44. The wafer 56 is laser annealed to activate the implant.

Referring to FIG. 11i, implantation leaves a layer 44' of epitaxial silicon having doped well regions 59 and underlying and adjacent undoped regions 60, and a patterned layer 61 of doped polycrystalline silicon. The undoped region 60 of the silicon 44' corresponds to the channel 8.

The wafer 62 is cleaned using acetone and IPA.

Referring to FIG. 11j, a blanket layer 63 of silicon dioxide ($SiO_2$) having a thickness of 400 nm is grown by chemical vapour deposition (CVD) over the upper surface 63 of the wafer 62.

A layer (not shown) of PMMA is applied (e.g. spun-on) to an upper surface 64 of the layer 63 of silicon dioxide and cured by baking. The PMMA layer (not shown) is patterned using a scanning electron beam and developed using a mixture of IPA and water.

Referring to FIG. 11k, the e-beam lithography stage leaves a PMMA layer 65 leaving an unexposed area 66 defining the vias.

Referring to FIG. 11l, in the unmasked areas 66, regions 67 of the silicon dioxide layer 65 are etched by a reactive ion etch 68, for example using trifluoromethane ($CHF_3$) as a feed gas, through to the doped well regions 59.

Referring to FIG. 11m, reactive ion etching leaves vias 17 in a patterned layer of silicon dioxide 63'.

Referring to FIG. 11n, a layer 68 of aluminium (Al) having a thickness of 400 nm is deposited using RF sputtering over an upper surface 69 of the patterned layer of silicon dioxide 63' and which covers side walls 70 and bottoms 71 of the vias 17.

A layer (not shown) of PMMA is applied (e.g. spun-on) to an upper surface 72 of the metallisation 72 and cured by baking. The PMMA layer (not shown) is patterned using a scanning electron beam and developed using a mixture of IPA and water.

Referring to FIG. 11o, this e-beam lithography stage leaves a PMMA layer 73 leaving an unexposed area 74.

Referring to FIG. 11p, unwanted regions 75 of metallization 68 are etched by a reactive ion etch 76, for example using a mixture of boron trichloride, trichloromethane and chlorine ($BCl_3:CHCl_3:Cl_2$) as a feed gas.

Referring to FIG. 11q, etch stage leaves metallic leads 12 on the upper surface 69 of the patterned layer of silicon dioxide 63'.

In some embodiments, a lift-off process can be used which involves defining a pattern in positive resist where the leads are to go, depositing Referring to FIG. 11r, regions 77, 78, 79, 80, 81, 82, 83 of the patterned top layer 63' of silicon dioxide, patterned layer 61 of doped polycrystalline silicon, patterned layer 54 of silicon dioxide, doped well regions 59, undoped epitaxial silicon layer 60, substrate 4 and doped well regions 20' respectively are removed by lapping. A lapping process and lapping apparatus is described in U.S. Pat. No. 6,881,124. Other forms of removing the side of the device may be used.

Lapping results in the device 1 shown in FIGS. 1 to 4. However, as mentioned earlier, a thin (e.g. equal to or less than 2 nm) protective layer of silicon dioxide or other material may be deposited or grown so as to cover at least part of the side face 5, e.g. corresponding to the channel 8 and/or gate 14.

If not already divided into chips, the wafer is divided into chips at this stage and the chips are packaged. As will be described later, the device 1 can be used in a read head in a hard disk drive.

Second Embodiment

Figure 12:
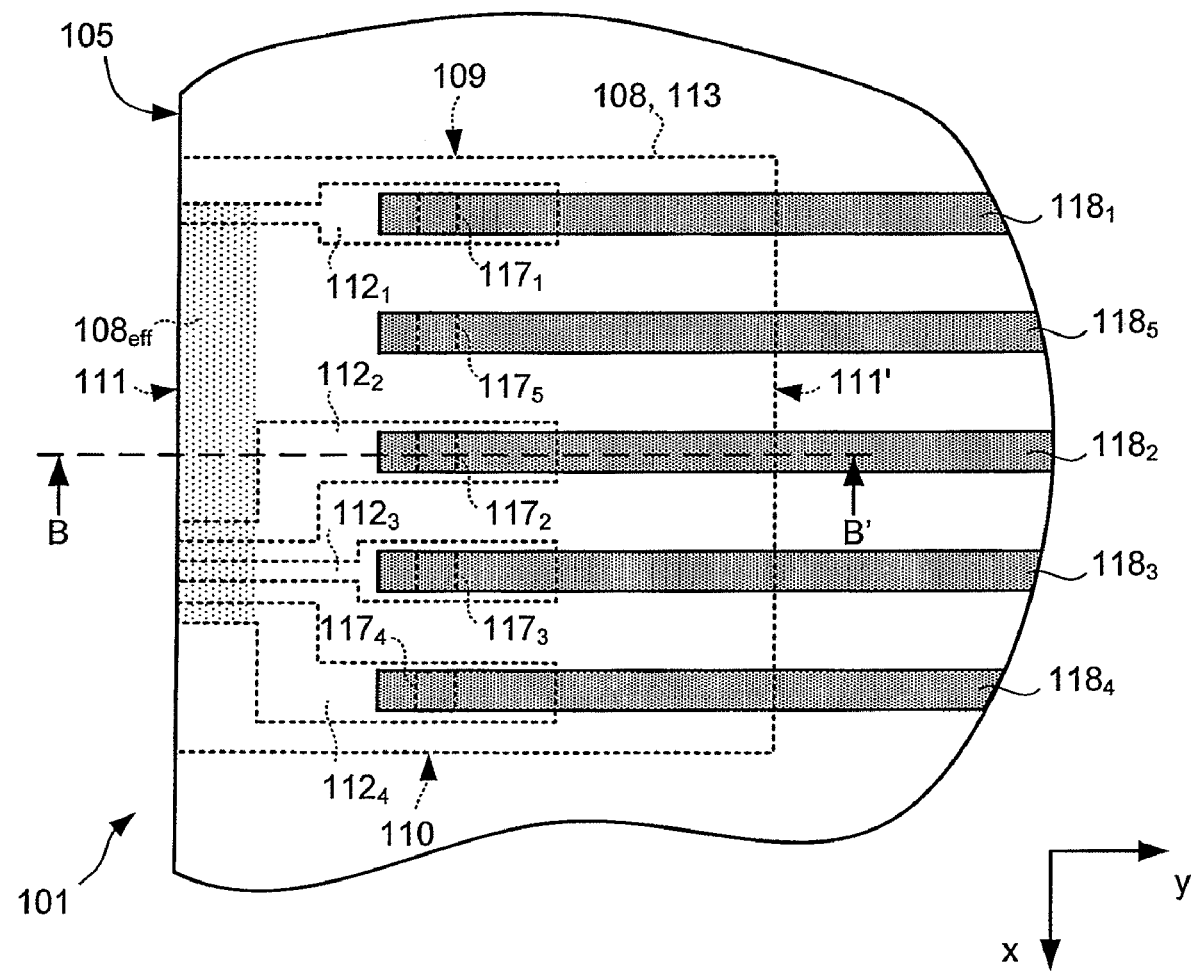
FIG. 12 is a plan view of a second embodiment of a magnetoresistance device in accordance with the present invention.
Figure 13:
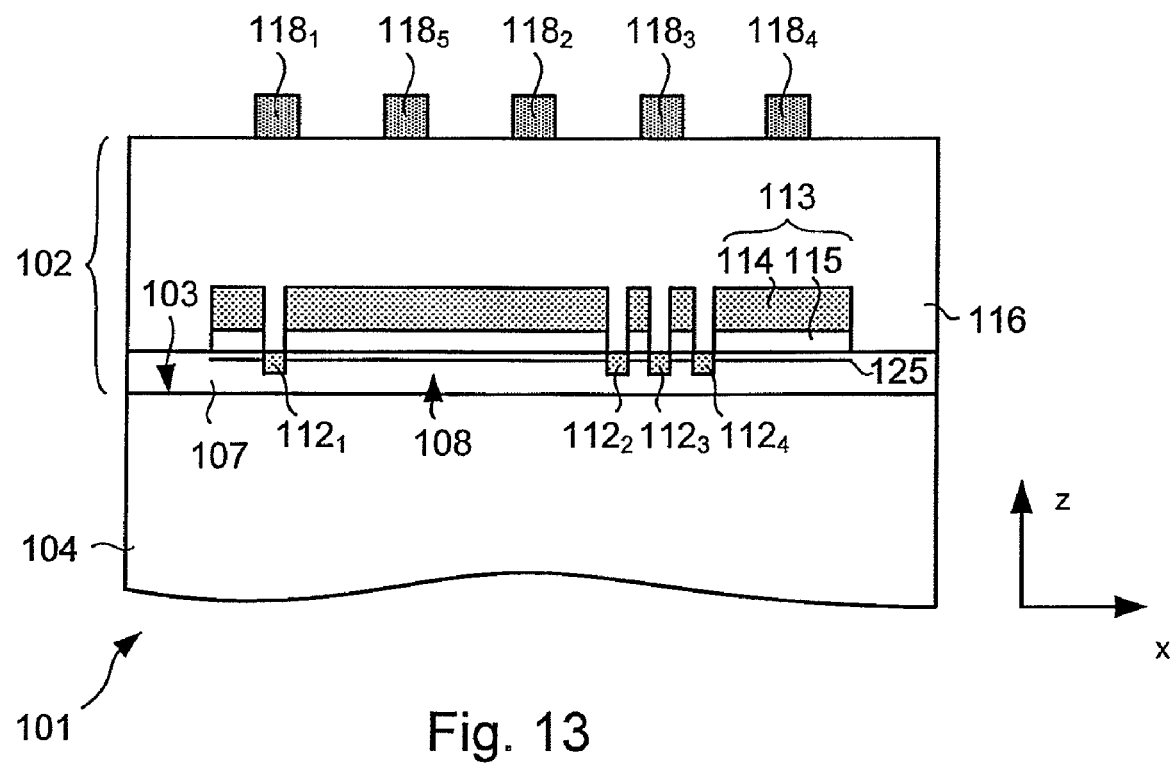
FIG. 13 is a side view the device shown in FIG. 12.
Figure 14:
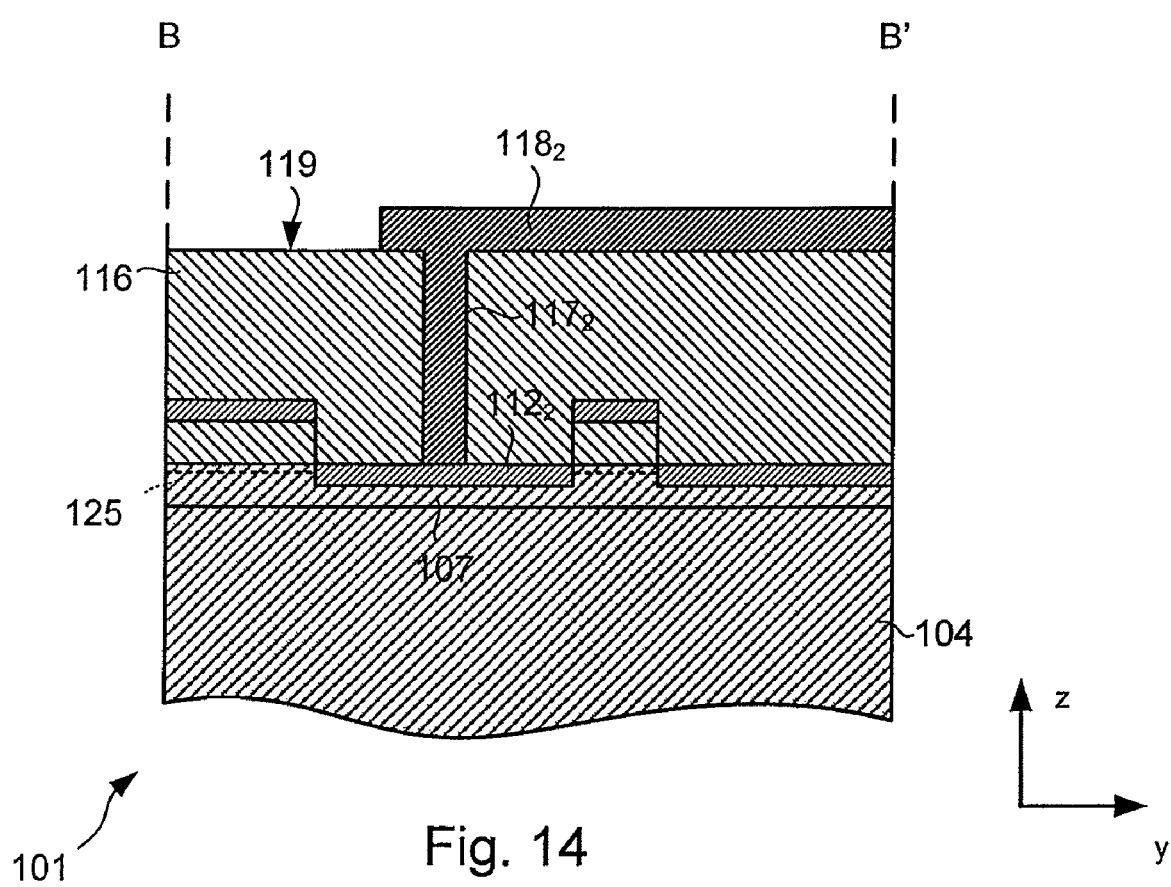
FIG. 14 is a cross-sectional view of the device shown in FIG. 12 taken along the line B-B'.

Referring to FIGS. 12 to 14, a second embodiment of a magnetoresistance device 101 according to the present invention is shown.

The second magnetoresistance device 101 is similar to the first magnetoresistance device 1 (FIGS. 1 to 4) hereinbefore described.

The device 101 includes a layer structure 102 formed on an upper surface 103 of a p-type substrate 104 and has a side face 105. The device 101 includes a layer 107 of epitaxially-grown, undoped single crystal silicon (Si), which provides a channel region 108 between first and second ends 109, 110 and which has a first side 111 which runs along the side face 105. The undoped silicon layer 107 includes first, second, third and fourth leads $112_1$, $112_2$, $112_3$, $112_4$. The device 101 has a top gate 113 including a gate electrode 114 and a gate dielectric 115 for forming an inversion layer 125 in the undoped silicon layer 107. The gate structure 113 is covered by an insulating top layer 116 having therein vias $117_1$, $117_2$, $117_3$, $117_4$, $117_5$. The leads $112_1$, $112_2$, $112_3$, $112_4$ and the gate electrode 114 are contacted by conductive tracks $118_1$, $118_2$, $118_3$, $118_4$, $118_5$ formed of aluminium.

Device geometry, materials and dimensions are substantially the same as those of the first device 1 (FIGS. 1 to 4) described earlier. For example, the channel 108, leads $112_1$, $112_2$, $112_3$, $112_4$ and gate electrode 114, gate dielectric 115 have substantially the same dimensions and comprise the same materials as the channel 8 (FIGS. 1 to 4), leads $12_1$, $12_2$, $12_3$, $12_4$ (FIGS. 1 to 4) and gate electrode 14 (FIGS. 2, 3 and 4) and gate dielectric 15 (FIGS. 1 to 4) described earlier.

The second magnetoresistance device 101 differs from the first magnetoresistance device 1 (FIGS. 1 to 4) hereinbefore described in that it does not have a shunt.

The device 101 can be controlled using the same circuit configuration 21 shown in FIG. 5.

When a gate voltage of 5 V is applied, if a current of 120 μA is applied between the first and third leads $112_1$, $112_3$, then the change of output voltage (ΔV) measured between the second and fourth electrodes $112_2$, $112_4$ is 25 mV when the change in applied magnetic field (ΔB) is 50 mT.

If the third lead $112_3$ is grounded and the first lead $112_1$ is biased at 1V, then the resistance between the first and third leads $112_1$, $112_3$ is about 7.1 kΩ and the resistance between second and fourth electrodes $112_2$, $112_4$ is about half the value between the first and third leads $112_1$, $112_3$.

The second device 101 can be simpler and cheaper to fabricate since fewer process steps are required and also exhibits a larger magnetoresistance compared with the first device 1 (FIG. 1).

Third Embodiment

Figure 15:
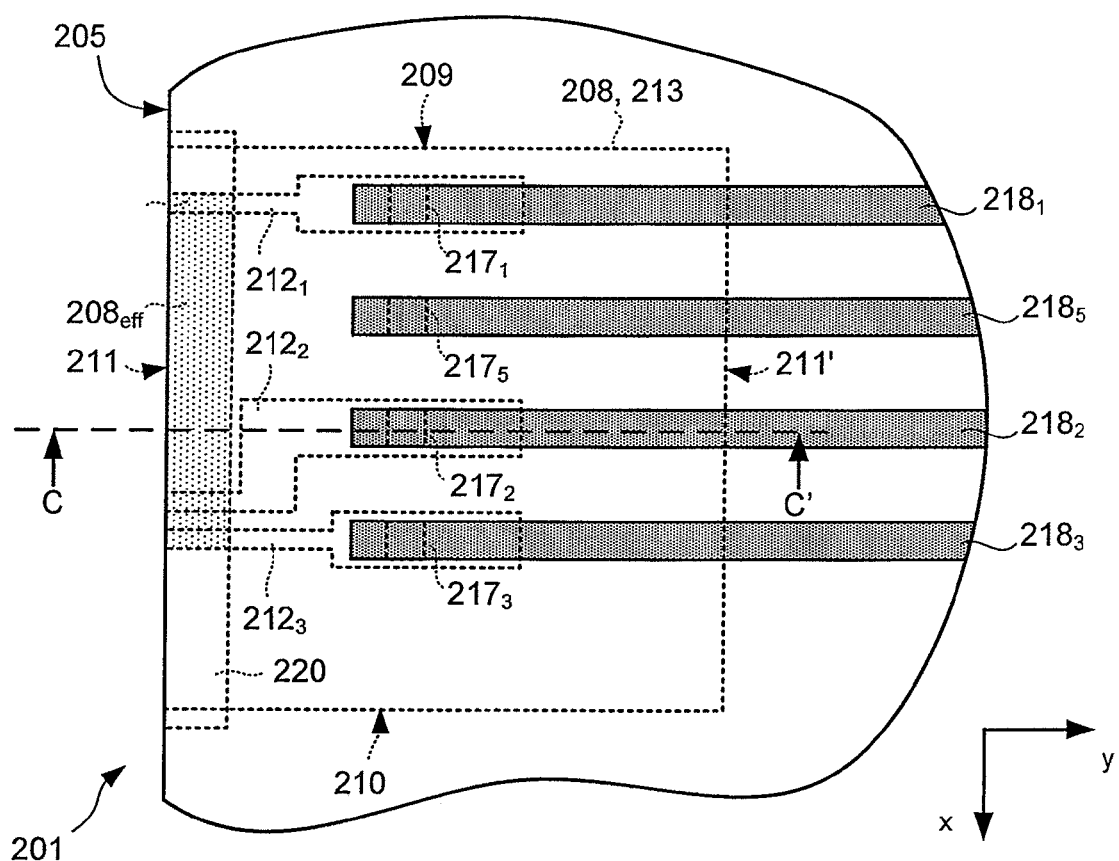
FIG. 15 is a plan view of a third embodiment of a magnetoresistance device in accordance with the present invention.
Figure 16:
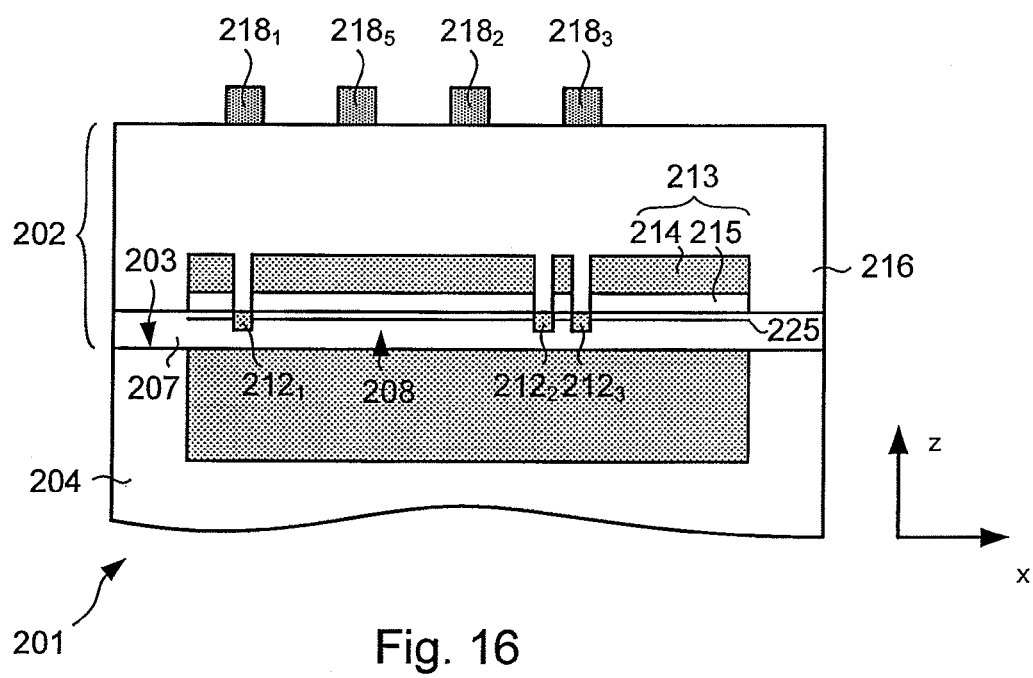
FIG. 16 is a side view the device shown in FIG. 15.
Figure 17:
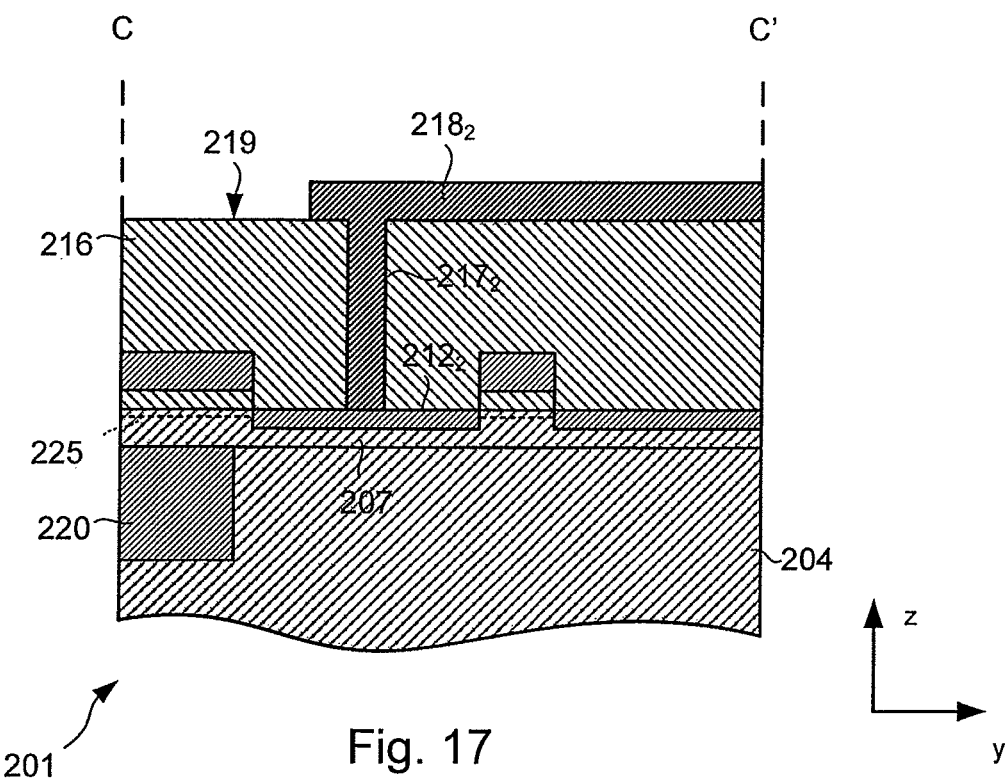
FIG. 17 is a cross-sectional view of the device shown in FIG. 15 taken along the line C-C'.

Referring to FIGS. 15 to 17, a third embodiment of a magnetoresistance device 201 according to the present invention is shown.

The third magnetoresistance device 201 is similar to the first magnetoresistance device 1 (FIGS. 1 to 4) hereinbefore described.

The device 201 includes a layer structure 202 formed on an upper surface 203 of a p-type substrate 204 and has a side face 205. The device 201 includes a layer 207 of epitaxially-grown, undoped single crystal silicon (Si), which provides a channel 208 between first and second ends 209, 210 and which has a first side 211 which runs along the side face 205. The undoped silicon layer 207 includes first, second and third leads $112_1$, $112_2$, $112_3$. The device 201 has a top gate structure 213 including a gate electrode 214 and a gate dielectric 215 for forming an inversion layer 225 in the undoped silicon layer 207. The gate structure 213 is covered by an insulating top layer 216 having therein vias $217_1$, $217_2$, $217_3$, $217_5$. The leads $212_1$, $212_2$, $212_3$ and the gate electrode 215 are contacted by conductive tracks $218_1$, $218_2$, $218_3$, $218_5$ formed of aluminium. The substrate 204 includes a heavily-doped n-type well 220 which serves as a shunt. The shunt 220 may be omitted.

The third magnetoresistance device 201 differs from the first magnetoresistance device 1 (FIGS. 1 to 4) hereinbefore described in that it has only three leads $212_1$, $212_2$, $212_3$. Furthermore, the lead width (i.e. $l_3$) and lead spacings (i.e. $s_1$ and $s_2$) are different from those of the first device 1 (FIG. 1). In particular, the leads $212_1$, $212_2$, $212_3$ each have a width of about 30 nm. The first and second leads $212_1$, $212_2$ are spaced apart by about 150 nm. The second and third leads $212_2$, $212_3$ are spaced apart by about 30 nm.

Otherwise, device geometry, materials and dimensions are substantially the same as those of the first device 1 (FIGS. 1 to 4) described earlier. For example, the channel 208, leads $212_1$, $212_2$, $212_3$, gate electrode 214, gate dielectric 215 and shunt 220 have substantially the same dimensions (other than lead width and spacings) and comprise the same materials as the channel 8 (FIGS. 1 to 4), leads $12_1$, $12_2$, $12_3$ (FIGS. 1 to 4) and gate electrode 14 (FIGS. 1 to 4), gate dielectric 15 (FIGS. 1 to 4) and shunt 20 (FIGS. 1 to 4) described earlier.

Figure 18:
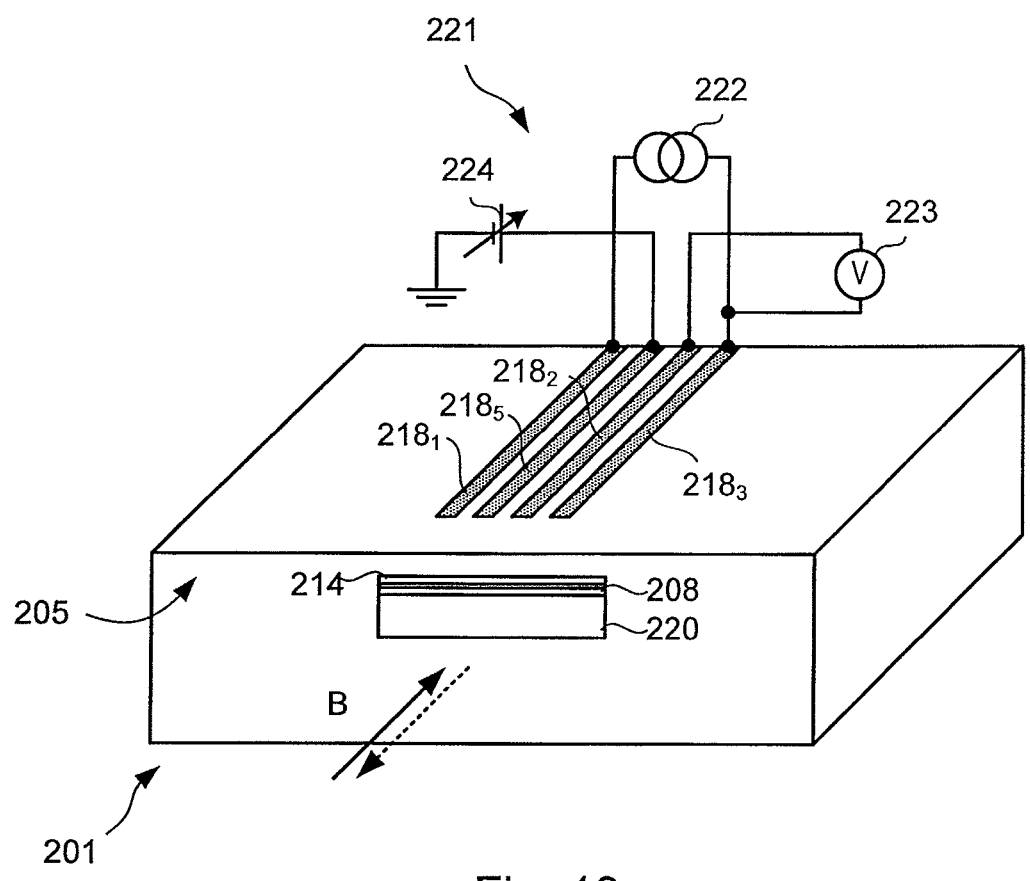
FIG. 18 is a schematic view of circuit arrangement for operating the device shown in FIG. 15.

Referring to FIG. 18, a circuit configuration 221 for operating the third device 201 is shown. The circuit configuration 221 includes a current source 222 configured to drive current, I, through the channel 208 between the first lead $212_1$ (FIG. 15) and the third lead $212_3$ (FIG. 15) and a voltmeter 223 configured to measure voltage, V, developed across the second and third leads $212_2$, $212_3$ (FIG. 15). A voltage source 224 is used to apply a bias, $V_G$, to the gate electrode 214.

Figure 19:
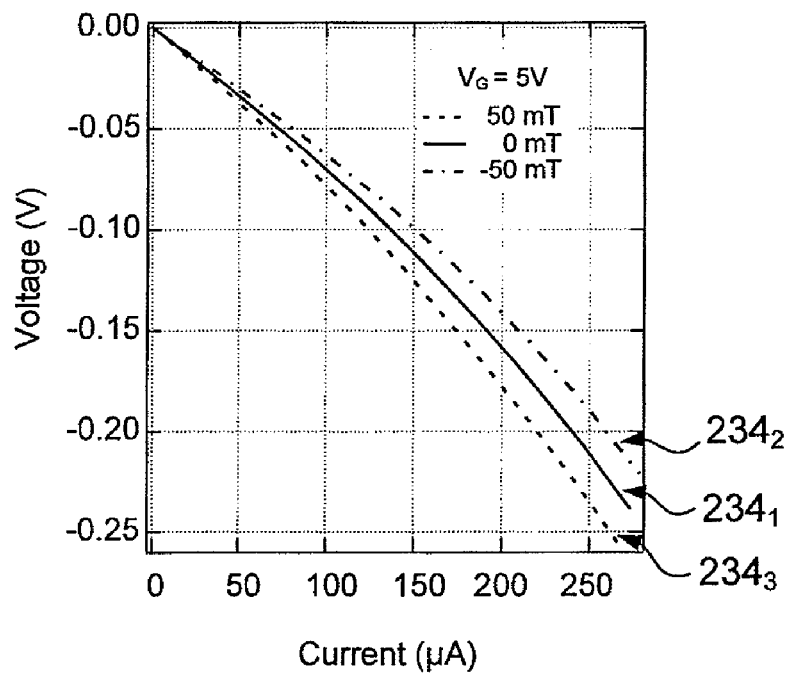
FIG. 19 illustrates current-voltage characteristics of the device shown in FIG. 15 at a fixed gate voltage at three different values of magnetic field.

FIG. 19 illustrates voltage-current characteristics $234_1$, $234_2$, $234_3$ of the third device 201 (FIG. 15) at a gate voltage of 5V and at three different magnetic fields, namely, B=0 mT, +50 mT and −50 mT, applied perpendicular to the side face 205 (FIG. 15). The measurement is taken using a configuration in which voltage, V, is sensed between the second and third leads $212_2$, $212_3$ (FIG. 15) while sweeping current, I, driven through the channel 208 between the first and third leads $212_1$, $212_3$ (FIG. 15).

Figure 20:
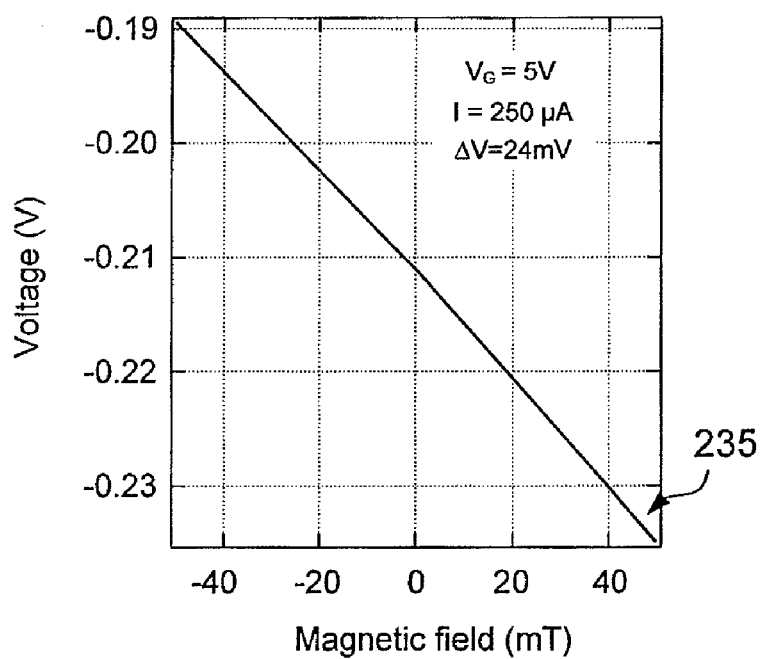
FIG. 20 illustrates voltage-magnetic field characteristic of the device shown in FIG. 15 at a fixed current and at a fixed gate voltage.

FIG. 20 illustrates a voltage-magnetic field characteristic 234 of the device 201 (FIG. 15) at a gate voltage of 5V and a current of 250 μA driven between the first and third leads $212_1$, $212_3$ (FIG. 15) as magnetic applied perpendicular to the side face 205 (FIG. 15) is swept from −50 mT to +50 mT.

As shown in FIG. 19, when a gate voltage of 5 V is applied, if a current of 260 μA is applied between the first and third leads $212_1$, $212_3$ (FIG. 15), then the change of output voltage (ΔV) measured between the second and third electrodes $212_2$, $212_3$ (FIG. 15) is 24 mV when the change in applied magnetic field (ΔB) is 50 mT. The output voltage between the second and third leads $212_2$, $212_3$ (FIG. 15) increases with increasing current.

If the third lead $212_3$ (FIG. 15) is grounded and the first lead $212_1$ (FIG. 15) is biased at 1V, then the resistance between the first and third leads $212_1$, $212_3$ (FIG. 15) is about 3.8 kΩ.

Fourth Embodiment

Figure 21:
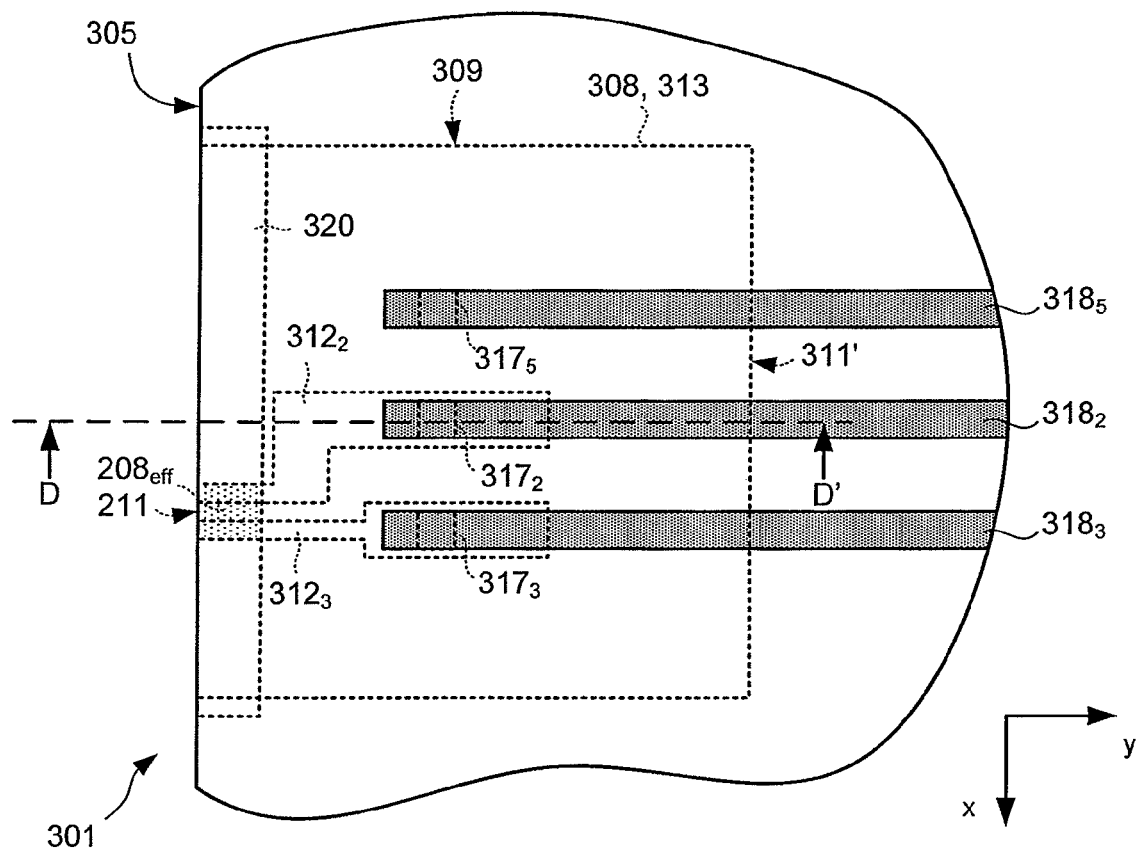
FIG. 21 is a plan view of a fourth embodiment of a magnetoresistance device in accordance with the present invention.
Figure 22:
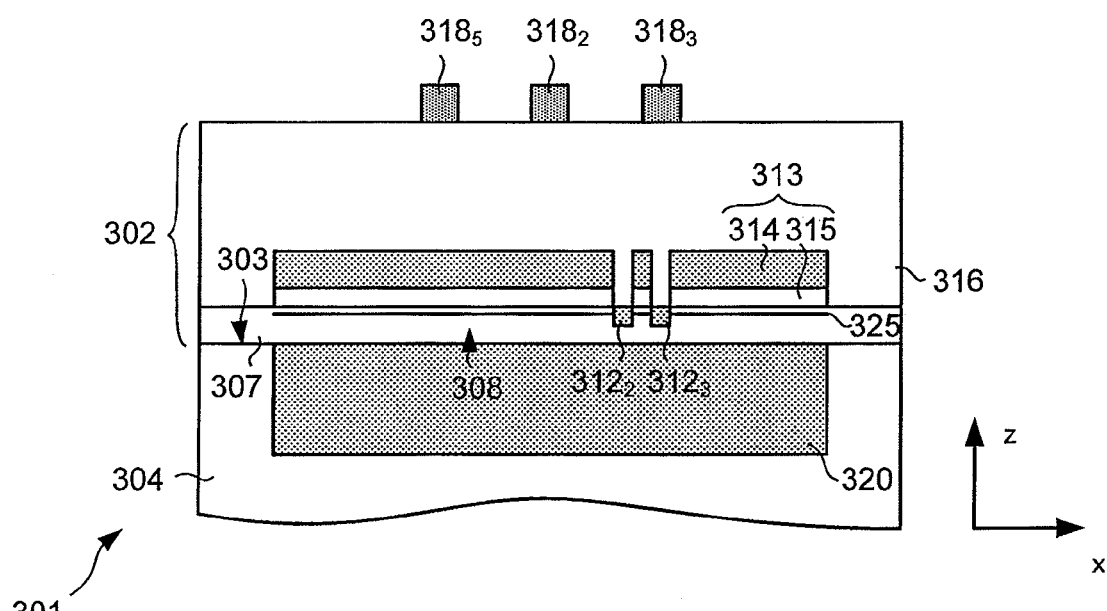
FIG. 22 is a side view the device shown in FIG. 21.
Figure 23:
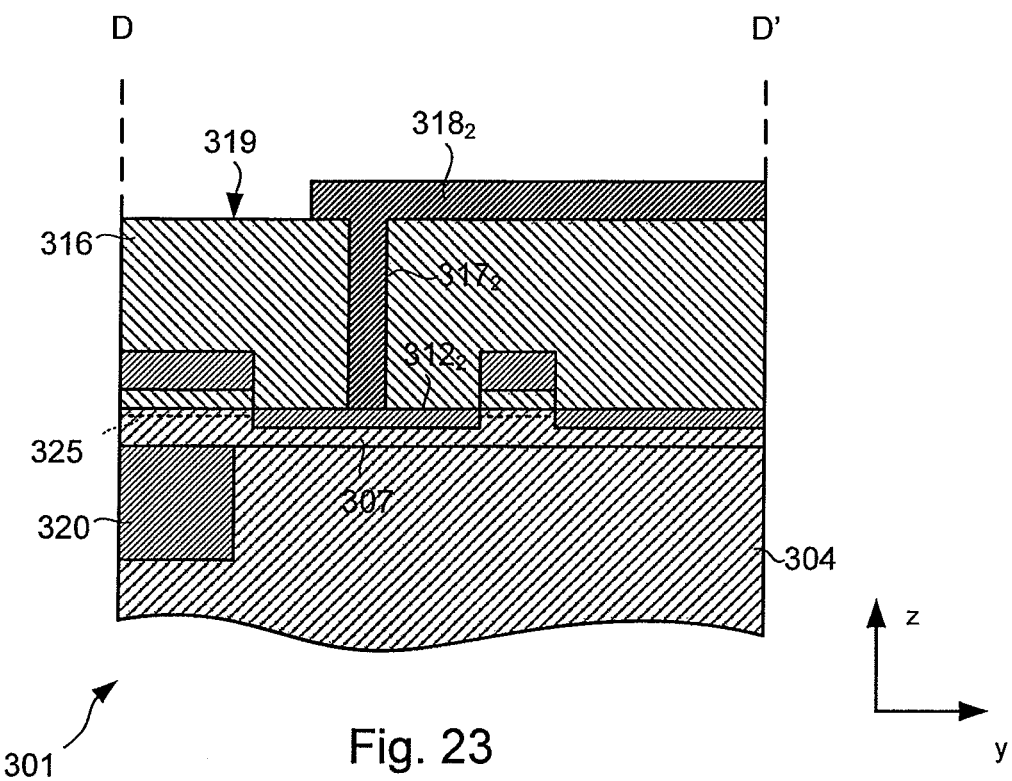
FIG. 23 is a cross-sectional view of the device shown in FIG. 21 taken along the line D-D'.

Referring to FIGS. 21 to 23, a fourth embodiment of a magnetoresistance device 301 according to the present invention is shown.

The fourth magnetoresistance device 301 is similar to the first magnetoresistance device 1 (FIGS. 1 to 4) hereinbefore described.

The device 301 includes a structure 302 formed on an upper surface 303 of a p-type substrate 304 and has a side face 305. The device 301 includes a layer 307 of epitaxially-grown, undoped single crystal silicon (Si), which provides a channel 308 between first and second ends 309, 310 and which has a first side 311 which runs along the side face 305. The undoped silicon layer 307 includes two leads $312_2$, $312_3$. The device 301 has a top gate structure 313 including a gate electrode 314 and a gate dielectric 315 for forming an inversion layer 325 in the undoped silicon layer 307. The gate structure 313 is covered by an insulating top layer 316 having therein vias $317_2$, $317_3$, $317_5$. The leads $312_2$, $312_3$ and the gate electrode 315 are contacted by conductive tracks $318_2$, $318_3$, $318_5$ formed of aluminium. The substrate 304 includes a heavily-doped n-type well 320 which serves as a shunt. The shunt 320 may be omitted.

The fourth magnetoresistance device 301 differs from the first magnetoresistance device 1 (FIGS. 1 to 4) hereinbefore described in that it has only two leads $312_2$, $312_3$. However, similar to first device 1, the leads $312_1$, $312_2$, $312_3$ each have a width of about 20 nm. The leads $312_2$, $312_3$ are spaced apart by about 20 nm.

Otherwise, device geometry, materials and dimensions are substantially the same as those of the first device 1 (FIGS. 1 to 4) described earlier. For example, the channel 308, leads $312_2$, $312_3$, gate electrode 314, gate dielectric 315 and shunt 320 have substantially the same dimensions (other than lead width and spacings) and comprise the same materials as the channel 8 (FIGS. 1 to 4), leads $12_1$, $12_2$, $12_3$ (FIGS. 1 to 4) and gate electrode 14 (FIGS. 1 to 4), gate dielectric 15 (FIGS. 1 to 4) and shunt 20 (FIGS. 1 to 4) described earlier.

Figure 24:
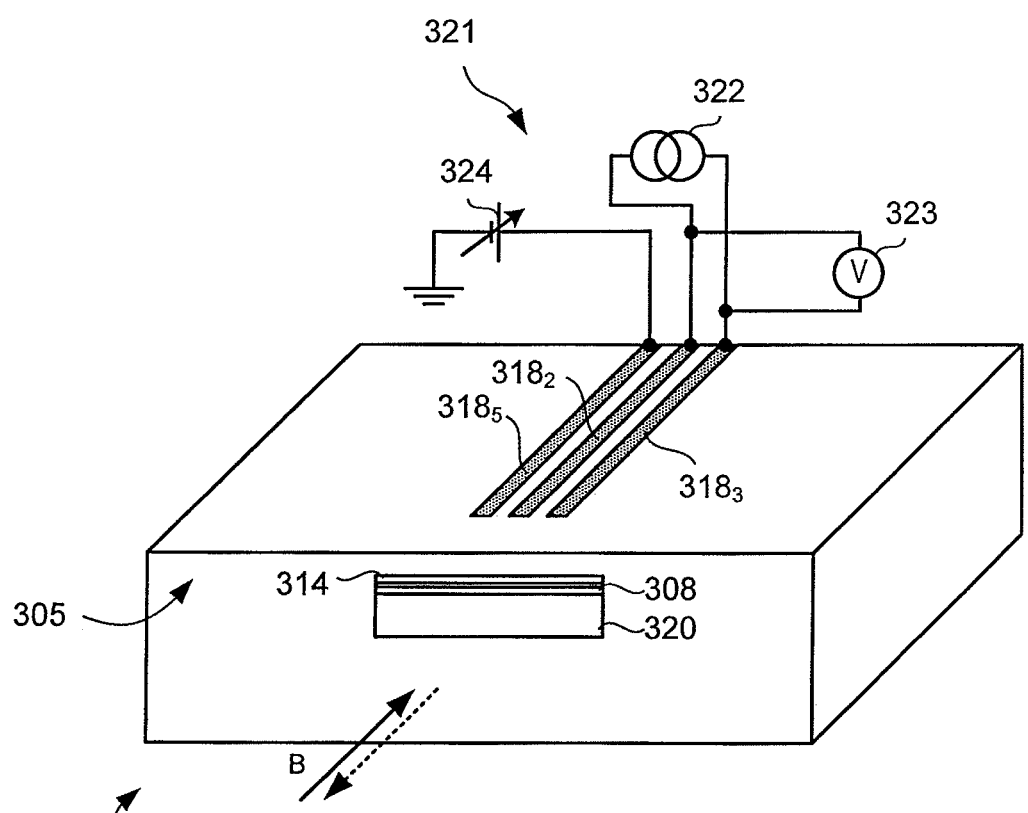
FIG. 24 is a schematic view of circuit arrangement for operating the device shown in FIG. 21.

Referring to FIG. 24, a circuit configuration 321 for operating the fourth device 301 is shown. The circuit configuration 321 includes a current source 322 configured to drive current, I, through the channel 308 between the leads $312_2$, $312_3$ (FIG. 21) and a voltmeter 323 configured to measure voltage, V, developed across the same leads $312_2$, $312_3$ (FIG. 21). A voltage source 324 is used to apply a bias, $V_G$, to the gate electrode 314.

Figure 25:
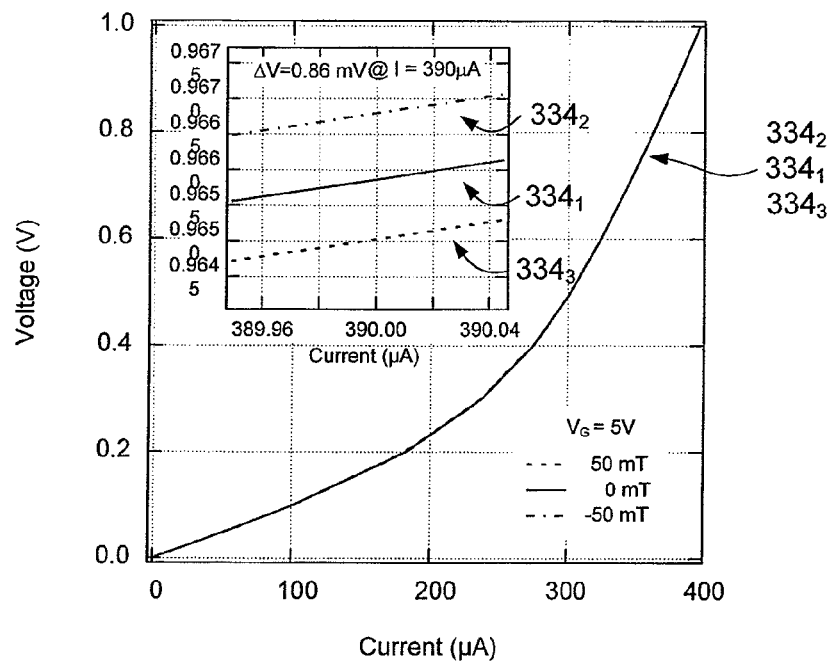
FIG. 25 illustrates current-voltage characteristics of the device shown in FIG. 21 at a fixed gate voltage at three different values of magnetic field.

FIG. 25 illustrates voltage-current characteristics $334_1$, $334_2$, $334_3$ of the fourth device 301 (FIG. 21) at a gate voltage of 5V and at three different magnetic fields, namely, B=0 mT, +50 mT and −50 mT, applied perpendicular to the side face 305 (FIG. 21). The measurement is taken using the configuration in which voltage, V, is sensed between the leads $312_2$, $312_3$ (FIG. 21) while sweeping current, I, driven through the channel 308 between the leads $312_2$, $312_3$ (FIG. 21).

As shown in FIG. 24, when a gate voltage of 5 V is applied, if a current of 390 μA is applied between the leads $312_2$, $312_3$ (FIG. 21), then the change of output voltage (ΔV) measured between the electrodes $312_2$, $312_3$ (FIG. 21) is 0.86 mV when the change in applied magnetic field (ΔB) is 50 mT. The output voltage between the second and third leads $312_2$, $312_3$ (FIG. 21) increases with increasing current.

The resistance measured between the leads $312_2$, $312_3$ (FIG. 21) is about 2.5 kΩ.

Fifth Embodiment

Figure 26:
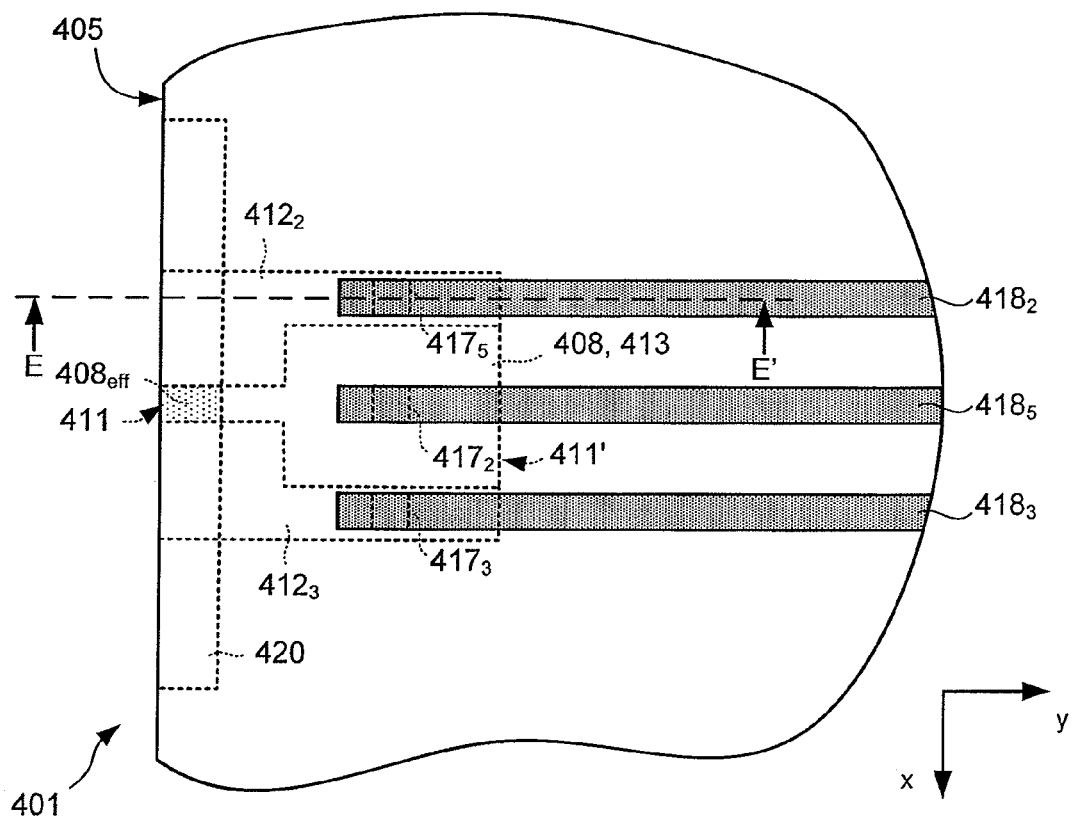
FIG. 26 is a plan view of a fifth embodiment of a magnetoresistance device in accordance with the present invention.
Figure 27:
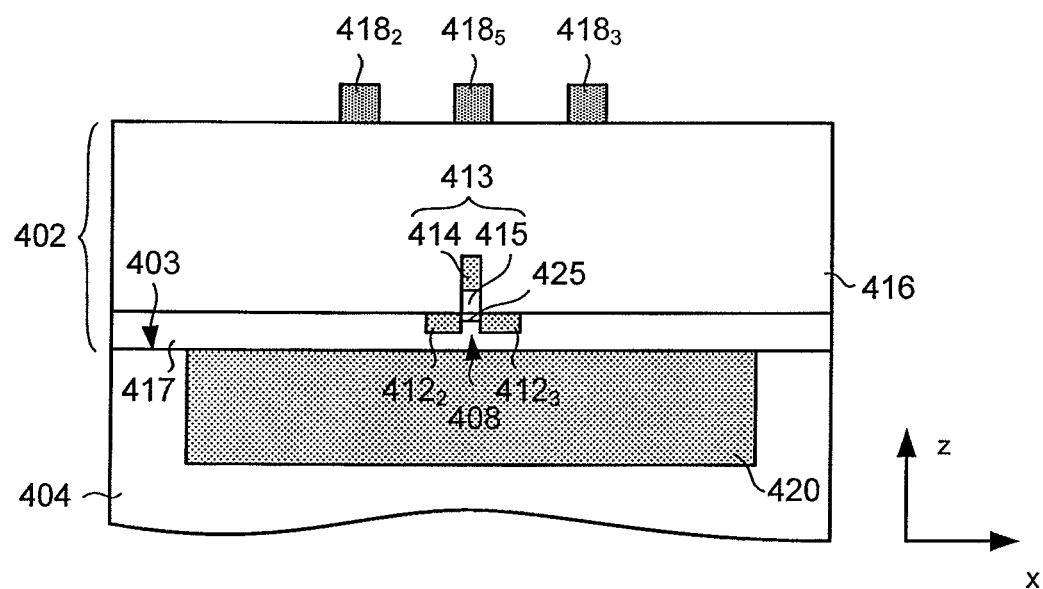
FIG. 27 is a side view the device shown in FIG. 26.
Figure 28:
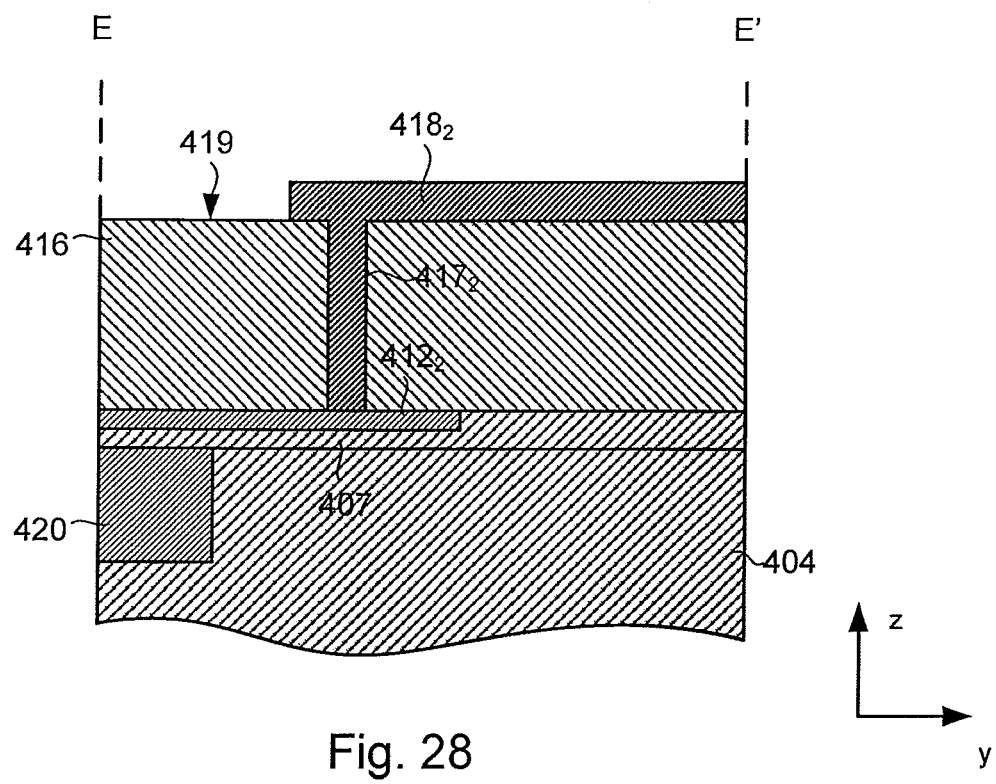
FIG. 28 is a cross-sectional view of the device shown in FIG. 26 taken along the line E-E'.

Referring to FIGS. 26 to 28, a fifth embodiment of a magnetoresistance device 401 according to the present invention is shown.

The device 401 includes a layer structure 402 formed on an upper surface 403 of a p-type substrate 404 and has a side face 405. The device 401 includes a layer 407 of epitaxially-grown, undoped single crystal silicon (Si), which provides a channel 408 between first and second ends 409, 410 and which has a first side 411 which runs along the side face 405. The undoped silicon layer 407 includes two heavily-doped n-type wells $412_2$, $412_3$ which provide leads. The device 401 has a top gate structure 413 including a gate electrode 414 and a gate dielectric 415 for forming an inversion layer 425 in the undoped silicon layer 407. The gate structure 413 is covered by an insulating top layer 416 having therein vias $417_2$, $417_3$, $417_5$. The leads $412_2$, $412_3$ and the gate electrode 415 are contacted by conductive tracks $418_2$, $418_3$, $418_5$ formed of aluminium. The substrate 404 includes a heavily-doped n-type well 420 which serves as a shunt. The shunt 420 may be omitted.

The fifth magnetoresistance device 401 differs from the first magnetoresistance device 1 (FIGS. 1 to 4) hereinbefore described in that it has only two leads $412_2$, $412_3$, and that the gate structure is less extensive, namely that it is arranged just between the leads $412_2$, $412_3$. The leads $412_2$, $412_3$ each have a width of about 20 nm. The leads $412_2$, $412_3$ are spaced apart by about 20 nm.

Layer thicknesses and materials are substantially the same as those of the first device 1 (FIGS. 1 to 4) described earlier.

Figure 29:
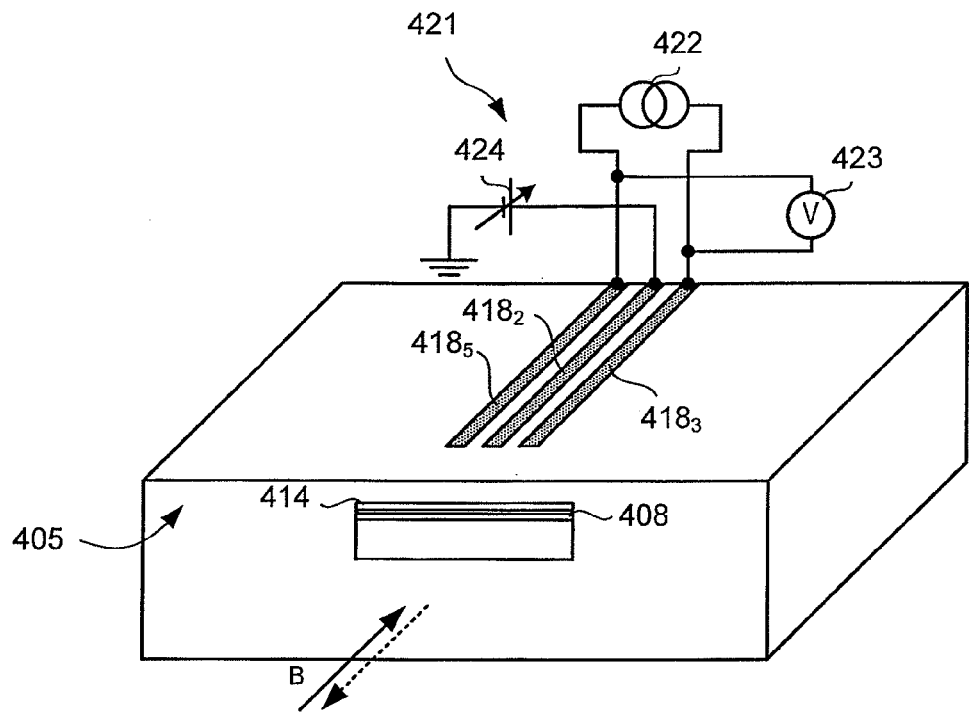
FIG. 29 is a schematic view of circuit arrangement for operating the device shown in FIG. 26.

Referring to FIG. 29, a circuit configuration 421 for operating the fourth device 401 is shown. The circuit configuration 421 includes a current source 422 configured to drive current, I, through the channel 408 between the leads $412_2$, $412_3$ and a voltmeter 423 configured to measure voltage, V, developed across the same leads $412_2$, $412_3$. A voltage source 424 is used to apply a bias, $V_G$, to the gate electrode 414.

Figure 30:
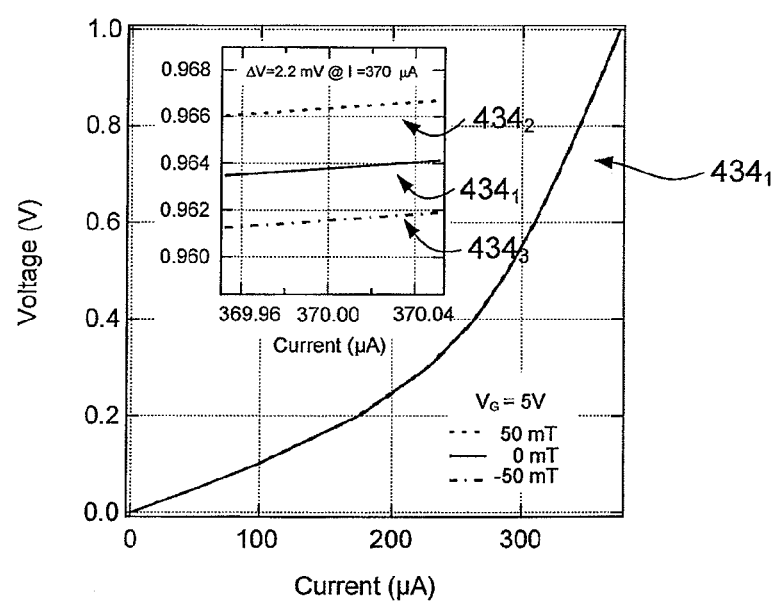
FIG. 30 illustrates current-voltage characteristics of the device shown in FIG. 26 at a fixed gate voltage at three different values of magnetic field.

FIG. 30 illustrates voltage-current characteristics $434_1$, $434_2$, $434_3$ of the fifth device 401 (FIG. 26) at a gate voltage of 5V and at three different magnetic fields, namely, B=0 mT, +50 mT and −50 mT, applied perpendicular to the side face 405 (FIG. 24). The measurement is taken using the configuration in which voltage, V, is sensed between the leads $412_2$, $412_3$ (FIG. 26) while sweeping current, I, driven through the channel 408 between the leads $412_2$, $412_3$ (FIG. 26).

As shown in FIG. 30, when a gate voltage of 5 V is applied, if a current of 370 μA is applied between the leads $412_2$, $412_3$ (FIG. 26), then the change of output voltage (ΔV) measured between the electrodes $412_2$, $412_3$ (FIG. 26) is 2.2 mV when the change in applied magnetic field (ΔB) is 50 mT. The output voltage between the second and third leads $412_2$, $412_3$ (FIG. 26) increases with increasing current.

The resistance measured between the leads $412_2$, $412_3$ (FIG. 26) is about 2.7 kΩ.

Read Head

Figure 31:
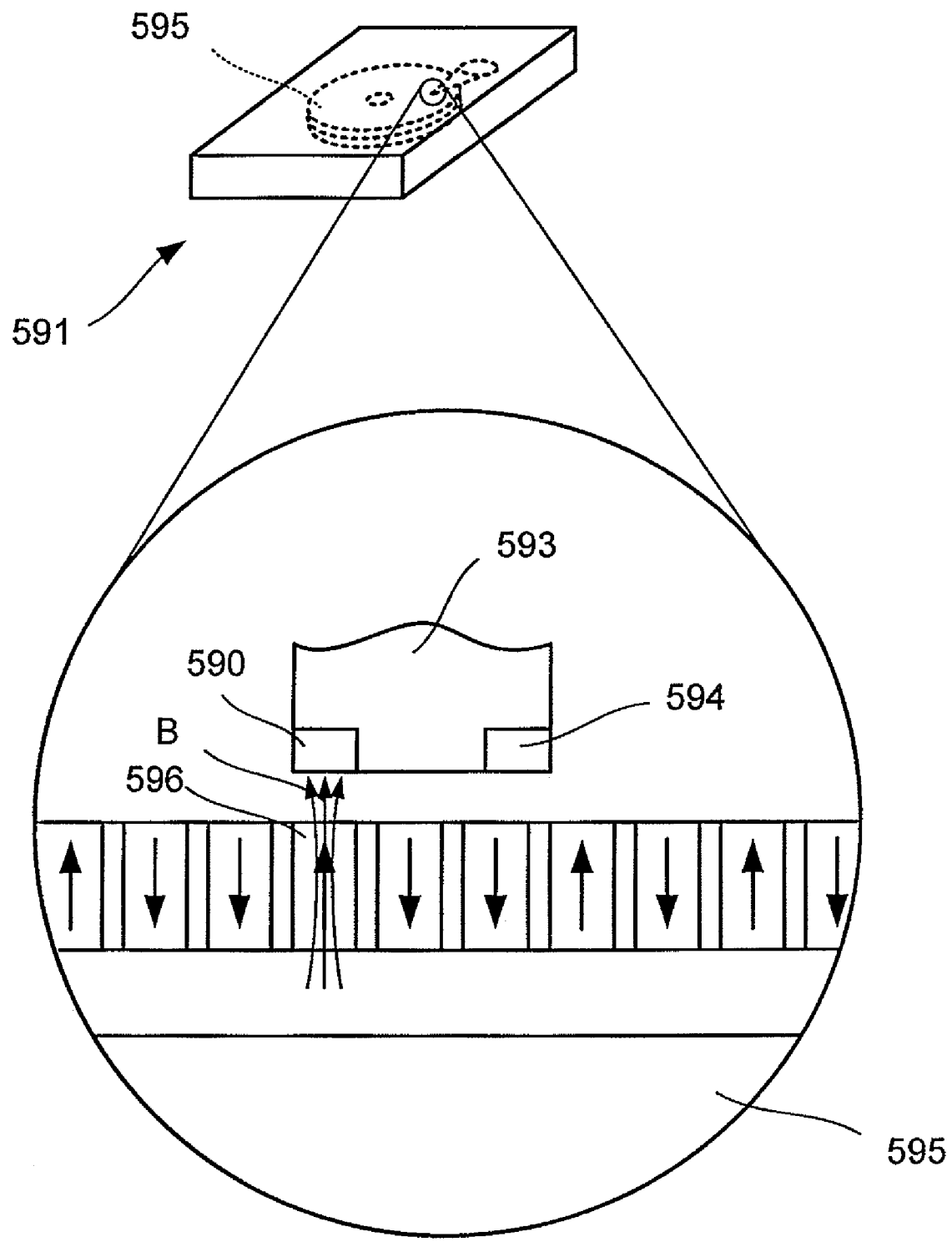
FIG. 31 is a schematic view of a hard disk driving including a magnetoresistance device in accordance with the present invention.

Referring to FIG. 31, the device 1 (FIG. 1), 101 (FIG. 12), 201 (FIG. 15), 301 (FIG. 21), 401 (FIG. 26) is useable as a read head 591 in a hard disk drive 592. The side face 5 (FIG. 1), 105 (FIG. 12), 205 (FIG. 15), 305 (FIG. 21), 405 (FIG. 26) of the device 1 (FIG. 1), 101 (FIG. 12), 201 (FIG. 15), 301 (FIG. 21), 401 (FIG. 26) is arranged face down as shown in FIG. 31.

A slider 593 supports the read head 591 and a write head 594 over a rotatable platen 595. The read head 591 measures magnetic field B produced by a perpendicularly-arranged bit cell 596 passing beneath it. The read head 591 may be used in a hard disk drive having longitudinally-arranged bit cells.

It will be appreciated that many modifications may be made to the embodiments hereinbefore described.

A bottom gate structure may be used in which the gate electrode lies under a gate dielectric and the gate dielectric lies under the channel.

A device may include a side gate structure rather than a top gate structure and have a top (or bottom) face instead of a side face such that the side of the channel runs along the top face. For example, a layer of non-ferromagnetic semiconductor material, such as silicon, may be etched to form a side wall and a gate structure comprising a layer of an insulating material and a layer of conductive material may be formed, e.g.

grown and/or deposited, over the side wall. The top of the structure may be etched or lapped to define a top face.

The side face may be substantially flat across the whole side of the device. A substantially flat face across the whole side of the device can be conveniently formed by lapping. However, the face, e.g. side face, need not be substantially flat across the whole of the device, e.g. across the whole side of the device. Instead, the side of device may be substantially flat in the vicinity of the channel, gate structure and shunt and form a projection with respect to the rest of the side of the device.

The gate electrode may be doped with an impurity (n-type or p-type) having a concentration of at least about $1\times10^{19}$ cm$^{-3}$, for example about $1\times10^{21}$ cm$^{-3}$.

The gate electrode need not comprise silicon, but may be formed from a metal, such as aluminium (Al) or gold (Au), or metal alloy. The gate electrode may include one or more layers. For example, the gate electrode may be a bi-layer, e.g. titanium (Ti) and gold (Au).

The device may be a silicon-based device. For example the channel, shunt and/or the leads may comprise a silicon-containing material, such as silicon or silicon-germanium (e.g. $Si_{0.9}Ge_{0.1}$)). Different silicon-containing materials can be used in different parts of the device.

Other elemental semiconductors, such as germanium, can be used. Compound semiconductors may be used, such as gallium arsenide (GaAs), indium arsenide (InAs) and indium antimonide (InSb) and other binary semiconductors and tertiary and quaternary semiconductors may be used. Heterostructures, such as AlGaAs/GaAs, may be used.

Strained semiconductors, e.g. strained silicon, may be used.

The channel may be undoped or doped with an impurity (n-type or p-type) up to a concentration of about $1\times10^{15}$ cm$^{-3}$, up to a concentration of about $1\times10^{16}$ cm$^{-3}$ or up to a concentration of about $1\times10^{17}$ cm$^{-3}$.

The shunt (if present) and/or the leads may be doped with an impurity (n-type or p-type) having a concentration of at least about $1\times10^{19}$ cm$^{-3}$, for example about $1\times10^{21}$ cm$^{-3}$, and/or may comprise one or more δ-doped layers.

The channel and/or shunt and/or leads may have a thickness between about 5 to 50 nm or a thickness between about 50 nm to 100 nm. Furthermore, the channel, shunt and leads may have different thicknesses. Different thicknesses may be achieved by depositing layers of different thicknesses or by masked etching.

The shunt may extend along a portion of the channel, i.e. less than the full length of the channel. The shunt need not be rectangular.

The leads may each have a thickness less than 50 nm. The channel may have a width (i.e. $w_1$) less than 100 nm and/or a length (i.e. $l_1$) less than 10 μm. The shunt may have a width (i.e. $w_2$) up to 500 nm and/or a length (i.e. $l_2$) less than 10 μm which may or may not be the same as the length of the channel. The leads may each have a width (i.e. $l_3$) up to 200 nm, the width being in a direction which corresponds to length for the channel. The leads need not be arranged perpendicularly with respect to the channel. End leads, for example first and sixth leads, may be arranged to approach the channel, e.g. channel, from the ends of the channel, rather than transversely. The leads need not be formed in plane with the channel. At least some of the leads can be arranged above and/or below the channel, i.e. underlie and/or overlie the channel. The device may include leads which are not used. For example, the device may comprise four or more leads, but fewer leads are used for driving and measuring signals through the channel.

An insulating layer which provides electrical insulation can be thicker or thinner than 150 nm.

Other concentrations and mixtures for etches and developers may be used. Other etches, resists and developers may be used. Etching, exposure and development times can be varied and can be found by routine experiment. The anneal temperature may also be found by routine experiment.

The invention claimed is:

1. A magnetoresistance device comprising:
    a channel extending between first and second ends in a first direction comprising non-ferromagnetic semiconducting material;
    a plurality of leads connected to and spaced apart along the channel;
    a gate structure for applying an electric field to the channel in a second direction which is substantially perpendicular to the first direction so as to form an inversion layer in the channel; and
    a face which lies substantially in a plane defined by the first and second directions and which is configured such that an edge of the channel runs along the face,
    wherein the channel comprises silicon or silicon germanium.

2. The device according to claim 1, wherein the gate structure comprises a gate electrode separated from the channel by a gate dielectric for applying an electric field to the channel.

3. The device according to claim 2, wherein the gate structure is a top gate structure wherein the gate dielectric is disposed on the channel and the gate electrode is disposed on the gate dielectric.

4. The device according to claim 2, wherein the gate electrode comprises semiconducting material.

5. The device according to claim 4, wherein the gate electrode is further comprised of silicon.

6. The device according to claim 1, wherein the channel is undoped or is doped with an impurity having a concentration up to about $1\times10^{16}$cm$^{-3}$.

7. The device according to claim 1, including a layer of the non-ferromagnetic semiconducting material disposed on a substrate and wherein the channel is formed in the layer of non-ferromagnetic semiconducting material.

8. The device according to claim 1, further comprising a substrate having a region of the non-ferromagnetic semiconducting material and wherein the channel is formed in the substrate.

9. The device according to claim 1, further comprising:
    a conductive region comprising non-ferromagnetic material having a higher conductivity than the channel and connecting at least two sections of the channel.

10. The device according to claim 9, wherein the conductive region comprises semiconducting material.

11. The device according to claim 10, wherein the conductive region is doped with an impurity having a concentration of at least about $1\times10^{19}$cm$^{-3}$.

12. The device according to claim 9, wherein the conductive region lies under the channel.

13. The device according to claim 12, wherein the conductive region is formed in a region of the substrate.

14. The device according to claim 10, wherein the gate electrode is further comprised of silicon.

15. The device according to any claim 1, wherein the face is a side face.

16. The device according to claim 1, which is a read head for a hard disk drive.

17. Apparatus comprising:
    a device according to claim 1; and
    a magnetic field source;

the magnetic field source and device arranged such that, when a magnetic field is applied to the device, the magnetic field passes substantially perpendicularly through the face.

18. A method of operating a magnetoresistance device comprising a channel extending between first and second ends in a first direction comprising non-ferromagnetic semiconducting material, a plurality of leads connected to and spaced apart along the channel, a gate structure for applying an electric field to the channel in a second direction which is substantially perpendicular to the first direction so as to form an inversion layer in the channel and a face which lies substantially in a plane defined by the first and second directions and which is configured such that an edge of the channel runs along the face, the method comprising:
 driving a current between two leads; and
 measuring a voltage developed between two leads.

19. The method according to claim 18, wherein the gate structure comprises a gate electrode separated from the channel by a gate dielectric for applying an electric field to the channel and the method further comprises:
 applying a bias of appropriate polarity and sufficient magnitude so as to form an inversion layer in the channel.

20. The method of fabricating a magnetoresistance device, the method comprising:
 providing a channel extending between first and second ends in a first direction comprising non-ferromagnetic semiconducting material, a plurality of leads connected to and spaced apart along the channel and a gate structure for applying an electric field to the channel in a second direction which is substantially perpendicular to the first direction so as to form an inversion layer in the channel; and
 defining a face which lies substantially in a plane defined by the first and second directions and which is configured such that an edge of the channel runs along the face,
 wherein the channel comprises silicon or silicon germanium.

21. The method according to claim 20, further comprising:
 forming a conductive region comprising non-ferromagnetic material having a higher conductivity than the channel and connecting at least two sections of the channel.

22. The method according to claim 21, wherein forming the conductive region includes:
 implanting ions into a region of a substrate; and
 forming the channel over the conductive region.

* * * * *